(12) United States Patent
Ogawa et al.

(10) Patent No.: US 7,492,232 B2
(45) Date of Patent: Feb. 17, 2009

(54) OSCILLATOR CIRCUIT, SEMICONDUCTOR DEVICE AND SEMICONDUCTOR MEMORY DEVICE PROVIDED WITH THE OSCILLATOR CIRCUIT, AND CONTROL METHOD OF THE OSCILLATOR CIRCUIT

(75) Inventors: Yasushige Ogawa, Kasugai (JP); Satoru Kawamoto, Kasugai (JP)

(73) Assignee: Fujitsu Microelectronics Limited, Tokyo (JP)

( * ) Notice: Subject to any disclaimer, the term of this patent is extended or adjusted under 35 U.S.C. 154(b) by 78 days.

(21) Appl. No.: 11/802,637

(22) Filed: May 24, 2007

(65) Prior Publication Data

US 2007/0222531 A1    Sep. 27, 2007

Related U.S. Application Data

(62) Division of application No. 11/372,146, filed on Mar. 10, 2006, now Pat. No. 7,239,210, which is a division of application No. 10/943,927, filed on Sep. 20, 2004, now Pat. No. 7,042,300.

(51) Int. Cl.
*H03B 1/00* (2006.01)
*H03B 5/00* (2006.01)
*H03B 5/24* (2006.01)

(52) U.S. Cl. ........................... 331/173; 331/57; 331/74; 327/534

(58) Field of Classification Search .................. 331/57, 331/74–77, 143, 153, 172, 173; 327/530, 327/534–537
See application file for complete search history.

(56) References Cited

U.S. PATENT DOCUMENTS 5,126,695 A    6/1992    Abe (Continued)

FOREIGN PATENT DOCUMENTS

EP    1 102 391 A2    5/2001

(Continued)

OTHER PUBLICATIONS

Alvarez et al., "A Scalable Resistor-less PLL Design for PowerPC™ Microprocessors", Proceedings of the International Conference on Computer Desig. ICCD. VLSI In Computers and Processors, Austin, IEEE Comp. Soc. Press. p. 293-300, XP010201814 (Oct. 7, 1996).

(Continued)

*Primary Examiner*—David Mis
(74) *Attorney, Agent, or Firm*—Arent Fox LLP

(57) ABSTRACT

There is provided an oscillator circuit capable of obtaining stable frequency by avoiding output having unstable frequency that is likely to occur to an operation/stop-control-feasible type oscillator circuit when oscillation begins. In such an oscillator circuit, an oscillation permitting signal (EN) sets an oscillator section in oscillation-operable state, whereby a controller section starts operation. The controller section that has stared its operation change an oscillation-frequency control signal (VR) into a signal value corresponding to predetermined oscillation frequency so as to set oscillation frequency at an oscillator section. Further on, the oscillator section outputs an oscillation signal in response to a detection signal (MON) that is outputted after a detector section compares a signal inputted therein with a predetermined signal value and detects that the inputted signal reaches a predetermined signal value. Thereby, transient state of an oscillation-frequency control signal (VR) can be detected. That is, there can be avoided an output of an unstable oscillation signal due to a transient oscillation-frequency control signal (VR).

14 Claims, 28 Drawing Sheets

FIFTH PRINCIPLE DIAGRAM OF PRESENT INVENTION

U.S. PATENT DOCUMENTS

| | | |
|---|---|---|
| 5,162,757 A | 11/1992 | Williams et al. |
| 5,355,097 A | 10/1994 | Scott et al. |
| 5,548,249 A | 8/1996 | Sumita et al. |
| 5,923,201 A | 7/1999 | Suzuki |
| 6,084,483 A | 7/2000 | Keshtbod |
| 6,195,307 B1 * | 2/2001 | Umezawa et al. ........... 365/226 |
| 6,285,222 B1 | 9/2001 | Kitade |

FOREIGN PATENT DOCUMENTS

| | | |
|---|---|---|
| JP | 60-068413 | 4/1985 |
| JP | 03-067316 A | 3/1991 |
| JP | 04-259986 | 9/1992 |
| JP | 05-259825 A | 10/1993 |
| JP | 05-303656 A | 11/1993 |
| JP | 08-030351 A | 2/1996 |
| JP | 09-326679 A | 12/1997 |
| JP | 10-004347 | 1/1998 |
| JP | 10-107620 A | 4/1998 |
| JP | 11-298247 | 10/1999 |
| JP | 11-317623 | 11/1999 |

OTHER PUBLICATIONS

Yasuda, "High-Speed Wide-Locking Range VCO with Frequency Calibration", IEICE Trans. Fund. Of Elect., vol. E83-A, No. 12, XP001036415, pp. 2616-2622 (Dec. 2000).

* cited by examiner

FIRST PRINCIPLE DIAGRAM OF PRESENT INVENTION

SECOND PRINCIPLE DIAGRAM OF PRESENT INVENTION

THIRD PRINCIPLE DIAGRAM OF PRESENT INVENTION

FIG.4 FOURTH PRINCIPLE DIAGRAM OF PRESENT INVENTION

FIFTH PRINCIPLE DIAGRAM OF PRESENT INVENTION

CIRCUIT DIAGRAM OF FIRST EMBODIMENT

OPERATIONAL WAVEFORMS OF FIRST EMBODIMENT

FIG.8 CIRCUIT DIAGRAM OF SECOND EMBODIMENT

OPERATIONAL WAVEFORMS OF SECOND EMBODIMENT

CIRCUIT DIAGRAM OF THIRD EMBODIMENT
(CLAMP SEC.)

CIRCUIT DIAGRAM OF FOURTH EMBODIMENT
(CLAMP SEC.)

CIRCUIT DIAGRAM OF FIFTH EMBODIMENT
(DETECTOR SEC.)

CIRCUIT DIAGRAM OF SIXTH EMBODIMENT

OPERATIONAL WAVEFORMS OF SIXTH EMBODIMENT

FIG.15 CIRCUIT DIAGRAM OF SEVENTH EMBODIMENT

CIRCUIT DIAGRAM OF EIGHTH EMBODIMENT

FIG.18 OPERATIONAL WAVEFORMS OF EIGHTH EMBODIMENT

FIG.19 CIRCUIT DIAGRAM OF NINTH EMBODIMDNT

FIG.20 FIRST MODIFICATION OF EMBODIMENTS INCLDING PRE-SET SEC.

FIG.21  SECOND MODIFICATION OF EMBODIMENTS INCLUDING PRE-SET SEC.

FIG.22 SEMICONDUCTOR DEVICE INCLUDING OSCILLATOR CIRCUITS

FIG.23 SEMICONDUCTOR MEMORY DEVICE INCLUDING OSCILLATOR CIRCUITS

CIRCUIT BLOCK DIAGRAM OF FIRST PRIOR ART

FIRST SPECIFIC EXAMPLE OF FIRST PRIOR ART

SECOND SPECIFIC EXAMPLE OF FIRST PRIOR ART

OPERATIONAL WAVEFORMS OF FIRST PRIOR ART
(FIRST AND SECOND SPECIFIC EXAMPLES)

THIRD SPECIFIC EXAMPLE OF FIRST PRIOR ART

FIG.29 PRIOR ART  OPERATIONAL WAVEFORMS OF FIRST PRIOR ART (THIRD SPECIFIC EXAMPLE)

CIRCUIT DIAGRAM OF SECOND PRIOR ART

OPERATIONAL WAVEFORMS OF SECOND PRIOR ART

OSCILLATOR CIRCUIT, SEMICONDUCTOR DEVICE AND SEMICONDUCTOR MEMORY DEVICE PROVIDED WITH THE OSCILLATOR CIRCUIT, AND CONTROL METHOD OF THE OSCILLATOR CIRCUIT

CROSS-REFERENCE TO RELATED APPLICATION

This is a divisional application, which claims the benefit of U.S. patent application Ser. No. 11/372,146, filed Mar. 10, 2006 now U.S. Pat. No. 7,239,210. Which in turn is a divisional application of U.S. patent application Ser. No. 10/943,927, filed Sep. 20, 2004 now U.S. Pat. No. 7,042,300. The disclosure of the prior application(s) is hereby incorporated herein in its entirety by reference.

BACKGROUND OF THE INVENTION

1. Field of the Invention

The present invention relates to an oscillator circuit which is capable of controlling its actuation/stoppage, a semiconductor device and a semiconductor memory device provided with the oscillator circuit, and a control method of the oscillator circuit. More particularly, the invention relates to operational stability at the start of oscillation.

2. Description of the Related Art

In view of the recent progress in electronic devices having advanced functions, there is a strong demand for the reduction of current consumption in a circuit of semiconductor devices or semiconductor memory devices together with the demand for advanced functions. Technologies for reducing current consumption are now considered to be a necessity not only for portable electric devices but it is considered essential for future products in connection with the recent tendency of energy conservation caused by an increase in environmental problems.

To meet such a demand, control has been performed to reduce bias current necessary for circuit operation to the limit, and to stop unnecessary circuit operation. The same control is conducted for oscillating operation of an oscillator circuit. Circuitry has been presented, in which a bias current necessary for oscillating operation is reduced to the limit. Control to reduce current consumption such as stopping the oscillating operation of the oscillator circuit and further shutting off a current path of a bias circuit in a stand-by period such as a power-down mode where operation of only a limited circuit is conducted.

In a semiconductor device 1000 shown in FIG. 22, when an external interface of a voltage higher than its own power source voltage is necessary, or when access is made to a memory cell, a boosted voltage higher than the power source voltage may be necessary, or a negative voltage may be necessary for backgate biasing of a MOS transistor. Accordingly, a boosting/negative power source circuit 200 is provided. Generally, in the semiconductor device 1000, in order to generate a boosted voltage higher than a power source voltage or a negative voltage of reverse polarity inside the device, electric charges must be supplied to a capacitor by a charge pump system or the like, or drawn out from the capacitor. Thus, an oscillation signal is entered from an oscillator circuit 100 to the boosting/negative power source circuit 200.

Here, the reason why two sets of oscillator circuits 100 are provided in FIG. 22 is to supply an oscillation signal to the boosting/negative power source circuit 200 according to the operation state in the semiconductor device 1000. For one oscillator circuit 100, an activation signal ACT is entered into an enable (EN) terminal. For the other oscillator circuit 100, a stand-by signal SBY inverted from the activation signal ACT is entered into an enable (EN) terminal.

If the activation signal ACT is in an activated state, since an internal circuit 400 is in an operating state, the boosting/negative power source circuit 200 must have a sufficient power supplying capability. Accordingly, in order to secure a sufficient power supply capability from the boosting/negative power source circuit 200, the oscillator circuit 100 activated by the activation signal ACT must output an oscillation signal at a high oscillation frequency. At this time, the oscillator circuit 100 activated by the stand-by signal SBY is in a stopped state.

If the stand-by signal SBY is in an activated state, the internal circuit 400 is in a stand-by state. In this case, current consumed at the semiconductor device 1000 must be reduced to the minimum. Accordingly, it is only necessary for the boosting/negative power source circuit 200 to supply minimum required power to maintain a bias state in the internal circuit 400. Thus, the oscillator circuit 100 activated by the stand-by signal SBY may be operated at a lower frequency compared with that in the activated state. At this time, the oscillator circuit 100 activated by the activation signal ACT is in a stopped state.

In a semiconductor memory device 2000 shown in FIG. 23, as in the case of the semiconductor device 1000 (FIG. 22), a boosting/negative power source circuit 200 may be necessary for supplying a boosted voltage or a negative voltage to an internal circuit 410. An oscillator circuit 100 which oscillates at a high frequency during activation, and an oscillator circuit 100 which oscillates at a low frequency in a stand-by period are switched to be used. Further, in the semiconductor memory device 2000, a refresh control circuit 300 is provided to refresh electric charges stored in a memory cell 500. At the oscillator circuit 100, a refreshing cycle is timed to perform cyclical refreshing operation. In the semiconductor memory device 2000, this oscillator circuit 100 is configured to operate when the activation signal ACT is in an activated state. In an operation specification of the portable device or the like in which data holding operation is necessary only in an activated state, current consumption can be reduced to the limit during a stand-by period by stopping the oscillator circuit 100 in a stand-by state to suspend the refreshing operation.

Hereinafter, an oscillator circuit 100 as a first prior art is described. The oscillator circuit 100 in FIG. 24 includes a controller section 4 in addition to an oscillator section 5, and an oscillation frequency of the oscillator section 5 is controlled to be a predetermined frequency by an oscillation-frequency control signal VR from the controller section 4. The controller section 4 and the oscillator section 5 are controlled by an enable signal EN, and actuated/stopped according to the enable signal EN. They are designed such that unnecessary oscillating operation is stopped by the control of the enable signal EN, thereby reducing current consumption. In order to achieve oscillating operation with a predetermined frequency by required minimum current consumption, the controller section 4 is constructed separately from the oscillator section 5 to supply a required minimum bias. In stoppage, the operation is stopped to reduce current consumption.

FIG. 25 shows an oscillator circuit of a first specific example of the first prior art. In the controller section 410, a switch element 5100 controlled by the enable signal EN is connected to a power source voltage VDD and a source terminal of a PMOS transistor TP100, and an oscillation-frequency control signal VR is output from a gate terminal and a drain terminal connected to each other. Connection is also made through a resistance element 8100 to a ground voltage VSS. The oscillation-frequency control signal VR is generated by a bias current IC flowing on a current path formed through the switch element S100, the PMOS transistor TP100 and the resistance element 8100. Here, the bias current IC is generally set to a small current value limited by a request for a low current consumption operation. For example, if a resistance value of the resistance element 8100 is set to 1 MΩ, then the bias current IC is set to about several microamperes.

In an oscillator section 500, odd stages (3 stages in FIG. 25) of inverter elements INV100 to INV102 are connected in a loop to form a ring oscillator. A power source terminal of each of the inverter elements INV100 to INV102 is connected through a PMOS transistor TP101 to a power source voltage VDD. A gate terminal of the PMOS transistor TP101 is controlled by an oscillation-frequency control signal VR. An oscillation signal VOSC is output from the inverter element INV102 through a switch element S101 controlled by the enable signal EN.

FIG. 26 shows an oscillator circuit of a second specific example of the first prior art. An oscillator section 54 is provided in place of the oscillator section 5J0 of the first specific example. The oscillator section 54 includes a NOR element NOR100 in place of the inverter element INV102, and the enable signal EN is entered into the other input terminal of the NOR element NOR100.

In the first and second specific examples, the enable signal EN is activated in a low level state. The switch element S100 is made conductive to supply the bias current IC to the controller section 410, and a control line VR is biased by the oscillation-frequency control signal VR. At each of the oscillator sections 54, and 500 which receive the oscillation-frequency control signal VR, a bias current IC equivalent to that of the controller section 410 flows as a driving current, and the ring oscillator performs oscillating operation. In the first specific example, an oscillation signal VOSC is output because the switch element 5101 is in a conductive state. In the second specific example, the ring oscillator is operated to output an oscillation signal VOSC because the NOR element NOR100 receiving the low level enable signal EN functions as a logic inversion element.

FIG. 28 shows an oscillator circuit of a third specific example of the first prior art. A controller section 420 is provided in place of the controller section 410 of the second specific example. In the controller section 420, in place of the switch element 5100, a switch element 5102 is inserted between a resistance element 8100 and a ground voltage VSS. The switch element 5102 is controlled by the enable signal EN. The enable signal EN is inverted by an inverter element INV103, and entered into the other input terminal of a NOR element NOR100.

In the third specific example, as shown in FIG. 29, the enable signal EN is activated in a high level state. The switch element.S102 is made conductive to supply a bias current IC to the controller section 420, and a control line VR is biased by an oscillation-frequency control signal VR. A bias current IC also flows to an oscillator section 54, thereby causing a ring oscillator to oscillate. In the third specific example, the enable signal is inverted by the inverter element INV103, and entered at a low level to the NOR element NOR100. The NOR element NOR100 functions as a logic inversion element, and the ring oscillator is operated to output an oscillation signal VOSC.

As a second prior art of an oscillator circuit 100, an oscillator circuit disclosed in Japanese Laid-open Patent Publication No. 11-317623 is shown in FIG. 30. The oscillator circuit in FIG. 30 comprises an oscillator section 910 and a pulse generator section 920. A monostable multi-vibrator MM of the pulse generator section 920 detects rising of a power source voltage VCC, and generates a high-level control pulse signal P of a fixed time tl. Accordingly, a switch SW is kept ON for the fixed time tl after power is supplied to the oscillator section 910, supplying a large initial current to a piezoelectric vibrator X.

FIG. 31 shows an operational waveform at a starting time. When a power source voltage VCC rises at a time T1, the multi-vibrator MM detects this rising, and generates a control pulse P of the time tl. The switch SW is turned ON to supply a large initial current to the piezoelectric vibrator X. By the switch SW, oscillation is started earlier by a time t2.

However, in the oscillator circuit 100 (FIG. 24) of the first prior art, as shown in the circuit diagrams of the first to third specific examples (FIGS. 25, 26 and 28), the enable signal EN is entered into the oscillator sections 5, 54 and 500 to control the actuation/stoppage of the oscillation, and also control may be made to permit/inhibit outputting of an oscillation signal VOSC. The controller sections 4, 410 and 420 where the enable signal EN is entered control the oscillation-frequency control signal VR for controlling oscillation frequencies of the oscillator sections 5, 54 and 500. Since a predetermined time is required until the control line VR reaches the oscillation-frequency control signal VR after the activation of the enable signal EN, the oscillation frequency becomes unstable for a period until the oscillation signal VOCS is shifted to a stable state where oscillation occurs at a predetermined frequency. This is a problem because a certain unstable period is present after the activation. The presence of such an unstable period may cause the following specific problems.

At the oscillator sections 5, 54 and 500, since a control state is determined only by a logical level of the enable signal EN, when the enable signal EN is activated, an oscillation state is set simultaneously. On the other hand, at the controller sections 4, 410 and 420, the current path being shut off in the stand-by state is established by the activation of the enable signal EN to supply the bias current IC, and thus the control line VR is set up to the oscillation-frequency control signal VR. Here, since the bias current IC is a small current value limited by the request for the low current consumption operation, a predetermined time is required until the control line VR reaches the oscillation-frequency control signal VR. The oscillator sections 5, 54 and 500 are oscillated at the same time with the activation of the enable signal EN. Consequently, the oscillation signal is output at an oscillation frequency different from a predetermined frequency with respect to a transient voltage level until the oscillation-frequency control signal VR is reached. This period is an unstable period, causing various problems in circuit operation.

An unstable period X1 shown in FIG. 27 is generated in the first and second specific examples (FIGS. 25 and 26). At the controller section 410 of the first and second specific examples, the control line VR is reduced to the ground voltage VSS in an inactive period when the enable signal EN is at a high level. When the enable signal EN becomes low level, and activated, the control line VR is gradually increased. However, if the bias current is a small current value, a predetermined time (unstable period X1) is required until the oscillation-frequency control signal VR is reached. Thus, in this period, a low voltage is applied to the PMOS transistor TP101 of each of the oscillator sections 54 and 500 by the oscillation-frequency control signal VR, and the ring oscillator is driven by a driving current larger than the set bias current IC. This causes the oscillation signal VOS to be oscillated at a frequency higher than a predetermined frequency.

In the unstable period X1, in addition to an increase in current consumption of the oscillator circuit 100 itself, a speed of the circuit operation of the boosting/negative power source circuit 200 or the like in the semiconductor device 1000 or the semiconductor memory device 2000 becomes higher than necessary. In the semiconductor memory device 2000, the refresh control circuit 300 executes a refreshing operation at a cycle shorter than necessary, causing a great amount of current to be consumed. In the case of operation in an environment where a power supplying capability is limited such as battery driving, or in an environment where impedance of the power supply path cannot be ignored, the great amount of current consumption in the unstable period X1 reduces a power source voltage supplied to the semiconductor device 1000 or the semiconductor memory device 2000 more than necessary, causing an operational failure.

If the boosting/negative power source circuit 200 is operated at a frequency higher than necessary, a voltage equal to/higher than a set value may be generated, adversely affecting device reliability. Especially, this is a problem in a use environment of a cellular phone or the like where activation/inactivation of the enable signal EN is frequently repeated.

An unstable period X2 shown in FIG. 29 is generated in the third specific example (FIG. 28). At the controller section 420 of the third specific example, at an inactive time when the enable signal EN becomes low in level, the control line VR is increased near a voltage (VDD−Vthp) obtained by subtracting a threshold voltage Vthp of the PMOS transistor from the power source voltage VDD. When the enable signal EN becomes high in level, and activated, a voltage level of the control line VR is gradually reduced to the oscillation-frequency control signal VR. However, if the bias current IC is a small current value, a predetermined time (unstable period X2) is required. Accordingly, in this period, a high voltage is applied to the PMOS transistor TP101 of the oscillator section 54 by the oscillation-frequency control signal VR, and the ring oscillator may be driven or not driven by a driving current smaller than the set bias current IC. Thus, the oscillation signal VOSC is oscillated or oscillation-stopped at a frequency lower than a predetermined frequency.

In the unstable period X2, since the oscillation frequency of the oscillation signal VOSC becomes lower than the predetermined frequency, a voltage generated at the boosting/negative power source circuit 200 or the like in the semiconductor device 1000 or the semiconductor memory device 2000 becomes insufficient. If there is a shortage of boosted voltage, an operational failure in an external interface section or a failure of access to the memory cell may occur. If there is a shortage of negative voltage, backgate biasing of the MOS transistor may be insufficient, causing fluctuation in a threshold voltage, deterioration of noise resistance or the like.

In the semiconductor memory device 2000, the cycle of the refreshing operation to be controlled at the refresh control circuit 300 is extended more than necessary, causing a data loss depending on a data holding characteristic.

Now, a relation between the oscillation-frequency control signal VR and the oscillation frequency of the oscillation signal VOSC will be described. The oscillation frequency is decided by a propagation delay time of the inverters INV100 to INV102 or the like constituting the ring oscillator. In the case of the first to third specific examples where a driving capabilities of the transistors constituting the inverter elements INV100 to INV102 is sufficiently large, the propagation delay time is decided by the bias current IC which is a driving current supplied to each power source terminal. It is because a charging/discharging time of an input capacitor of each stage becomes a propagation delay time by the bias current IC. In other words, the oscillation frequency of the oscillation signal VOSC is proportional to the bias current IC.

The bias current IC is operated by a saturation characteristic of the PMOS transistor TP101, and has the following relation:

$$IC = K \times ((VDD - VR) - Vthp)^2$$

$$= K \times ((VDD - Vthp) - VR)^2$$

Here, K denotes a physical constant of the PMOS transistor TR101, and Vthp a positive value. Accordingly, a threshold voltage becomes −Vthp. This equation is established when VR<VDD−Vthp because it is based on the condition that a voltage between the gate and the source is not lower than the threshold voltage.

Thus, IC=0 is established when VR=VDD−Vthp, stopping the oscillating operation. In a region where VR<VDD−Vthp, the bias current IC is changed by a square characteristic with respect to a change of VR. In other words, the oscillation frequency is changed by a square characteristic with respect to the change of VR, causing great changes in the oscillation-frequency of the oscillation signal VOSC during the unstable periods X1 and X2.

In the oscillator circuit of the second prior art (FIG. 30), oscillation is started earlier by time t2 by the switch SW. However, an oscillation signal OUT immediately after the start of oscillation has small amplitude, and it is gradually increased to be stabilized. Even if the time until the oscillation start is shortened, the problem of the unstable period after the oscillation start still remains.

The second prior art is directed to circuitry where an operation is started with power-ON as a starting signal. As shown in FIG. 31, for a rising waveform of the power source voltage VCC, a steep voltage transition is assumed. Accordingly, the circuitry cannot be applied when it is mounted on the semiconductor device 1000 or the semiconductor memory device 2000 where a function is provided to change between the stand-by state of the power down mode or the like and the active state where a power source voltage is ON, and a starting operation is carried out based on an entry of a control signal such as the enable signal EN.

The fixed period tl when the control pulse P is at a high level is set by resistance element Ra and capacitor element Ca which are passive elements. On the other hand, the switch SW controlled to an ON state by the high-level control pulse P is an active element. Further, the fixed period tl for supplying an initial current to the piezoelectric vibrator X is selected by experiment in such a way as to make a starting time the shortest. As the passive and active elements are made of different elements and structures, generally, there are some differences between the two caused by the fact that they are manufactured separately. Thus, the fixed time tl decided by the passive elements Ra and Ca is arbitrarily combined with a threshold value to the ON state of the drive element SW and a driving capability, making it difficult to maintain the experimentally selected conditions.

For example, if the starting of the piezoelectric vibrator X becomes insufficient because of the shortage of the fixed time tl or the driving capability, starting time is further required after the end of the fixed time tl. Conversely, if the fixed time tl is excessive, the starting time of the piezoelectric vibrator X continues more than necessary. In either case, the optimization of the starting time is failed, which is a problem.

SUMMARY OF THE INVENTION

The present invention is made to resolve problems of the above described prior art. Prime object of the present invention is to provide an oscillator circuit capable of outputting oscillation signal with stable oscillation frequency, a semiconductor device and a semiconductor memory device provided with the oscillator circuit, and control method of the oscillator circuit. For achieving the prime object, there are taken the following countermeasures at the time of initiating oscillation where the inventive oscillator circuit can control to operate/stop oscillation. That is, the countermeasures to be taken are: (1) oscillation operation is stopped and an output of an oscillation signal is not permitted while transient oscillation frequency is unstable; or (2) a period that transient oscillation frequency is unstable is shortened To achieve the object, according to first aspect of the present invention, there is provided an oscillator circuit comprising: an oscillator section capable of oscillation operation in accordance with an oscillation permitting signal; a controller section for outputting an oscillation-frequency control signal that controls oscillation frequency of the oscillator section in accordance with the oscillation permitting signal; and a detector section for detecting the oscillation-frequency control signal and outputting a detection signal that controls the oscillator section in accordance with a detection result.

In the oscillator circuit directed to the first aspect of the present invention, the detector section detects an oscillation-frequency control signal outputted from the controller section in accordance with an oscillation permitting signal and outputs a detection signal in accordance with a detections result so as to control oscillation operation of the oscillator section.

Thereby, oscillation operation can be conducted with predetermined oscillation frequency in accordance with a detection result obtained by the detector section. The controller section starts its operation upon receipt of an oscillation permitting signal and even while transient period where an oscillation-frequency control signal from the controller section is unstable, the oscillator section does not conduct unstable oscillation operation. Oscillation is made with stable oscillation frequencies.

According to second aspect of the present invention, there is provided an oscillator circuit comprising: an oscillator section capable of oscillation operation in accordance with an oscillation permitting signal; a controller section for outputting an oscillation-frequency control signal that controls oscillation frequencies of the oscillator section in accordance with the oscillation permitting signal; and a delay section for outputting a delay signal, corresponding to an oscillation permitting signal to which a predetermined delay time is added, to the oscillator section.

In the oscillator circuit directed to the second aspect of the present invention, the delay section outputs a delay signal, corresponding to an oscillation permitting signal to which a predetermined delay time is added so as to control oscillation operation of the oscillator section.

Thereby, there can be added time for making a signal value of an oscillation-frequency control signal stable, as predetermined delay time. Furthermore, a stable oscillation signal can be obtained after an oscillation-frequency control signal becomes stable and reaches a signal value corresponding to the predetermined oscillation frequency.

Furthermore, according to third aspect of the present invention, there is provided a control method of an oscillator circuit that comprises an oscillator section capable of oscillation operation in accordance with an oscillation permitting signal and a controller section for outputting an oscillation-frequency control signal that controls oscillation frequency toward the oscillator section in accordance with the oscillation permitting signal, the control method of an oscillator circuit comprising: step where the oscillation-frequency control signal changes its states from initial state to predetermined-oscillation-frequency instructing state in accordance with the oscillation permitting signal; and step where there is conducted at least either initiation of oscillation operation of the oscillator section or output of an oscillation signal from the oscillator section in predetermined timing that is after the oscillation-frequency control signal reaches the predetermined-oscillation-frequency instructing state under oscillation-operable state due to the oscillation permitting signal.

Thereby, a stable oscillation signal can be obtained in predetermined timing that is taken after it reaches a state that an oscillation-frequency control signal gives an instruction the oscillator section to oscillate with the predetermined oscillation frequency.

Furthermore, according to fourth aspect of the present invention, there is provided an oscillator circuit comprising: an oscillator section for conducting oscillation operation with oscillation frequency in accordance with an oscillation-frequency control signal; a controller section for outputting the oscillation-frequency control signal through a control line to the oscillation section upon activation of an oscillation permitting signal; and a switch section arranged between an external signal generator circuit and the control line, the switch section becoming conductive while the oscillation permitting signal is deactivated and supplying a predetermined signal from the signal generator circuit to the control line.

In the oscillator circuit directed the fourth aspect of the present invention, an oscillation permitting signal is in activated state, the oscillator section and the controller section are activated and further on, oscillation operation is conducted while. An oscillation-frequency control signal to be outputted to the control section through the control line sets oscillation frequency. In case an oscillation permitting signal is deactivated, the oscillator section and the controller section are deactivated, as well. However, a predetermined signal is supplied to the control line from the external signal generator circuit through the switch section.

Furthermore, according to fifth aspect of the present invention, there is provided an control method of an oscillator circuit comprising: step to activate control operation of oscillation frequency upon activation of an oscillation permitting signal when oscillation operation is conducted in accordance with an oscillation-frequency control signal; and step to allow control state to shift itself to predetermined setting state so that the oscillation frequencies should shift to a setting value; wherein the control state is kept in predetermined state by a signal from an external signal generator section while the oscillation permitting signal is deactivated.

Furthermore, according to sixth aspect of the present invention, there is provided an oscillator circuit comprising: an oscillator section for conducting oscillation operation with oscillation frequency in accordance with an oscillation-frequency control signal; a first controller section for outputting the oscillation-frequency control signal through a control line to the oscillator section upon activation of an oscillation permitting signal; a pulse generator section for outputting a pulse signal when the oscillation permitting signal is activated; a second controller section for outputting a predetermined signal, the second controller section being activated by the pulse signal; and a switch section arranged between the second controller section and the control line, the switch section being made conductive by the pulse signal and supplying the predetermined signal to the control line.

In the oscillator circuit directed to the sixth aspect of the present invention, while an oscillation permitting signal is in activated state, the oscillator section and the first controller section are activated and further on, oscillation operation is conducted. An oscillation-frequency control signal to be outputted to the oscillation section from the first control section through the control line sets oscillation frequency. Along with timing that an oscillation permitting signal is activated, the switch section and the second controller section are activated while a period of a pulse signal outputted from the pulse generator section. Subsequently, a predetermined signal is supplied to the control line from the second control section through the switch section.

Furthermore, according to seventh aspect of the present invention, there is provided a control method of an oscillator circuit comprising: step to activate first control operation of oscillation frequencies upon activation of an oscillation permitting signal when oscillation operation is conducted in accordance with an oscillation-frequency control signal; and step to allow control state itself to shift to predetermined setting state so that the oscillation frequency should shift to a setting value; wherein the control method controls to activate second control operation that makes the controls state shift to predetermined state for a predetermined period that begins after activation of the oscillation permitting signal.

Thereby, a predetermined signal can be supplied to the control line while an oscillation permitting signal is deactivated and the controller section is deactivated subsequently, or while a predetermined period that an oscillation permitting signal makes transition to active state along with a pulse signal. Accordingly, there can be shortened delay that a signal at the control line reaches an oscillation-frequency control signal oscillation frequency of which is set when the control section or the first control section is activated upon activation of an oscillation permitting signal. Therefore, there can be shortened an unstable period of oscillation frequency when oscillation is permitted.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

DETAILED DESCRIPTION OF THE PREFERRED EMBODIMENTS

Next, a detailed description will be given of an oscillator circuit, a semiconductor device and a semiconductor memory device provided with the oscillator circuit, and a control method of the oscillator circuit according to first to ninth embodiments of the present invention with reference to the accompanying drawings.

Figure 1:
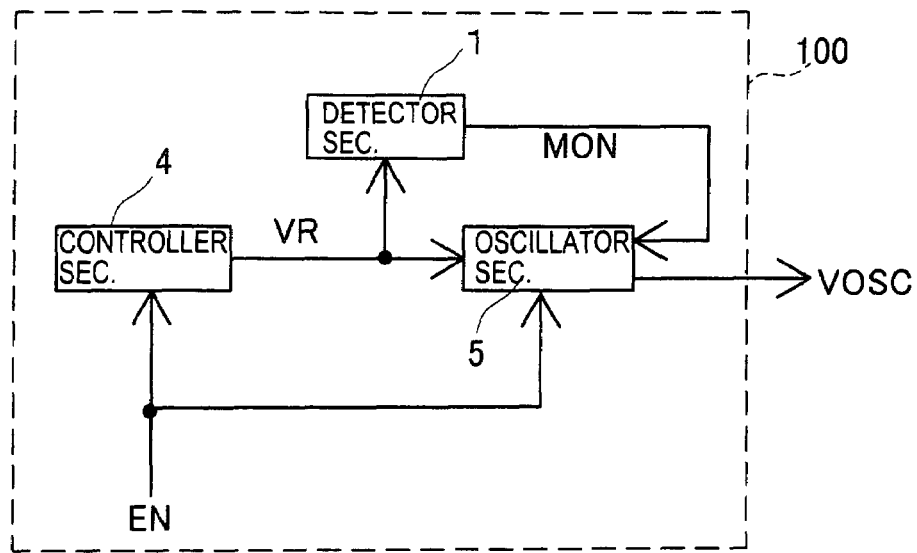
FIG. 1 is a first principle diagram of the present invention.

FIG. 1 is a first principle diagram of an oscillator circuit 100 of the present invention. A controller section 4 and an oscillator section 5 are controlled by an oscillation permitting signal (EN). By the oscillation permitting signal (EN), the oscillator section 5 is set to the oscillating operation enable state, and the controller section 4 starts its operation. The controller section 4 that has started the operation changes an oscillation-frequency control signal (VR) to a signal value corresponding to a predetermined oscillation frequency. The oscillation-frequency control signal (VR) is entered into the oscillator section 5 to set an oscillation frequency, and also entered into a detector section 1 to detect the signal value. A detection signal (MON) by the detector section 1 has been entered into the oscillator section 5.

The oscillation-frequency control signal (VR) output from the controller section 4 needs a predetermined time to reach the signal value corresponding to the predetermined frequency after it is started by the oscillation permitting signal (EN). Accordingly, the signal value of the oscillation-frequency control signal (VR) is compared with a predetermined signal value by the detector section 1, and the detection signal (MON) is output to the oscillator section 5 after detecting that the oscillation-frequency control signal (VR) reached the predetermined signal is detected. The oscillator section 5 is in the oscillation enable state by the oscillation permitting signal (EN), and is controlled to output an oscillation signal at a point of time when the detection signal (MON) is entered. Thus, it becomes possible to detect a transient period when the oscillation-frequency control signal (VR) after the starting of the controller section 4 is in a transient state, thereby preventing outputting of an unstable oscillation signal from the oscillator section 5 caused by setting of a transient oscillation-frequency control signal (VR).

Figure 2:
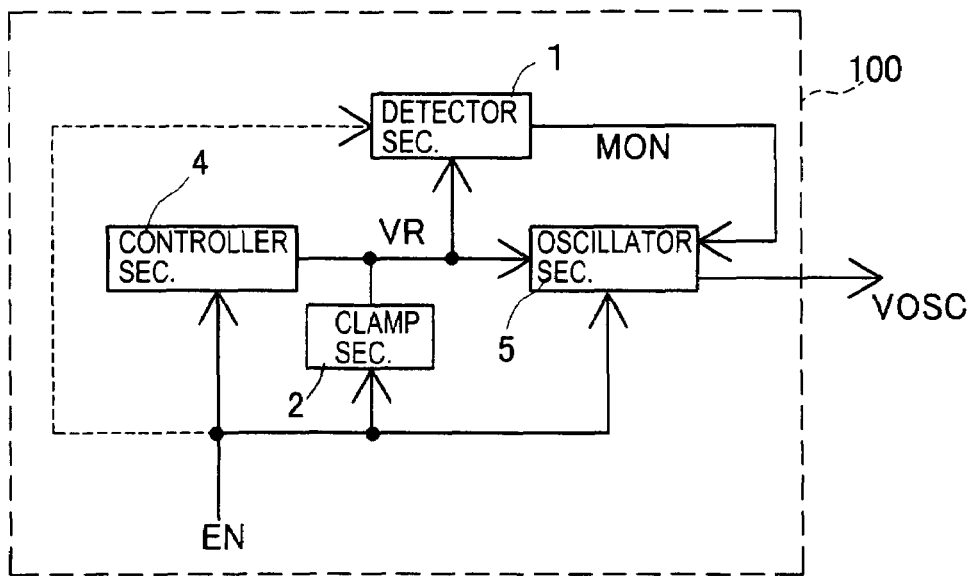
FIG. 2 is a second principle diagram of the present invention.

FIG. 2 is a second principle diagram of an oscillator circuit 100 of the present invention. In addition to the components of the first principle diagram, a clamp section 2 is provided for clamping an oscillation-frequency control signal (VR) to a predetermined value. The clamp section 2 is controlled by an oscillation permitting signal (EN).

In view of the current consumption, a detector section 1 only needs to be activated after starting of a controller section 4 by the oscillation permitting signal (EN) and, in an oscillation inhibiting state where no oscillation permitting signal (EN) is output, it is preferably set in an inactive state. Accordingly, by providing the clamp section 2 controlled by the oscillation permitting signal (EN), the oscillation-frequency control signal (VR) is maintained at a predetermined clamp value in the oscillation inhibiting state. By setting this clamp value to an inactive signal value in an input stage of the detector section 1, a detecting operation at the detector section 1 can be maintained in an inoperative state. In the oscillation inhibiting state, unnecessary current consumption does not occur at the detector section 1, thus contributing to lower current consumption.

As another method of maintaining the detector section 1 in the inactive state, an arrangement can be made where the detector section 1 itself can be controlled by the oscillation permitting signal (EN). By making a circuit operation of the detector section 1 inactive in the oscillation inhibiting state, the operation of the detector section 1 can be halted irrespective of a signal value of the oscillation-frequency control signal (VR).

Figure 3:
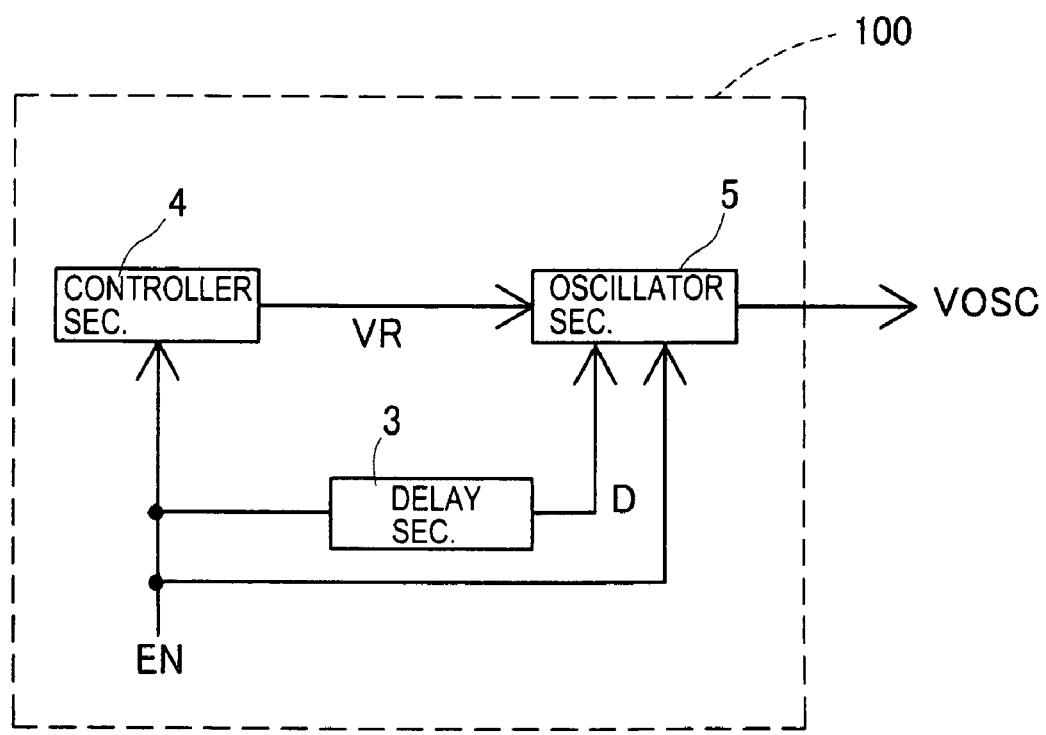
FIG. 3 is a third principle diagram of the present invention.

FIG. 3 is a third principle diagram of an oscillator circuit 100 of the present invention. A delay section 3 is provided in place of the detector section 1 of the first principle diagram. An oscillation permitting signal (EN) is entered into the delay section 3, which outputs a delay signal (D) where a predetermined delay time is added to EN to an oscillator section 5. The predetermined delay time is set in accordance with a transient period when an oscillation-frequency control signal (VR) changes after a controller section 4 is started by the oscillation permitting signal (EN).

At the delay section 3, a predetermined time more than the transient period until the oscillation-frequency control signal (VR) reaches a predetermined signal is timed, and the delay signal (D) is output to the oscillator section 5. The oscillator section 5 is in an oscillation enable state by the oscillation permitting signal (EN), and controlled to output an oscillation signal at a point of time when the delay signal (D) is entered. Accordingly, it is possible to operate the oscillator section 5 after a point of time when the oscillation-frequency control signal (VR) goes beyond the transient state, and reaches a stable signal value, thereby preventing outputting of an unstable oscillation signal from the oscillator section 5 caused by setting of a transient oscillation-frequency control signal (VR).

Figure 4:
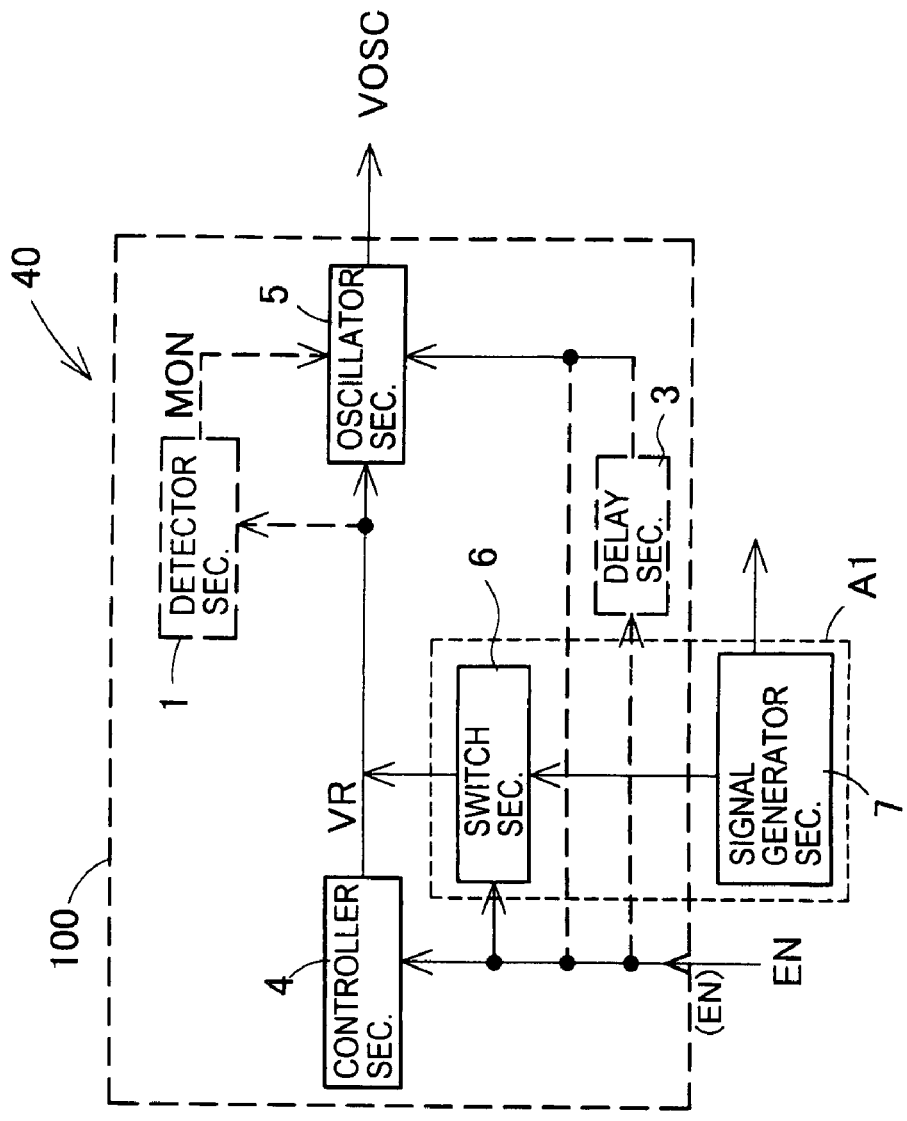
FIG. 4 is a fourth principle diagram of the present invention.

FIG. 4 is a fourth principle diagram of an oscillator circuit 100 of the present invention. A controller section 4 and an oscillator section 5 are connected to each other through a control line (VR), and both are controlled by an oscillation permitting signal (EN). By the oscillation permitting signal (EN), the oscillator section 5 is set in an oscillating operation enable state, and the controller section 4 starts its control operation. The controller section 4 that has started the control operation outputs an oscillation-frequency control signal (VR) set corresponding to a predetermined oscillation frequency through the control line (VR) to the oscillator section 5. A signal generator section 7 provided outside the oscillator section 100 is connected through a switch section 6 to the control line (VR). The switch section 6 is controlled by the oscillation permitting signal (EN).

The controller section 4 is started by the oscillation permitting signal (EN) to start its control operation. However, a request for low current consumption or the like may limit a driving capability small. In the limited driving capability, a long time may be necessary for the control line (VR) to reach the set oscillation frequency control signal (VR). Accordingly, by making the switch section 6 conductive in an inactive state of the oscillation permitting signal (EN), a predetermined signal from the signal generator section 7 is supplied to the control line (VR) beforehand. Here, the signal generator section 7 is a unit provided beforehand outside the oscillator circuit 100, which supplies a predetermined signal to other than the oscillator circuit 100. In the fourth principle of the invention, this predetermined signal is used.

In FIG. 4, a pre-set section A1 is configured with the external signal generator section 7 and the switch section 6. Since the predetermined signal is supplied to the control line (VR) when the oscillation permitting signal (EN) is in an inactive state, and when the oscillation permitting signal (EN) is changed to an active state, the control line (VR) can be set to a predetermined oscillation-frequency control signal (VR) in a short time even if the controller section 4 has a limited driving capability. Thus, it can prevent the output of an unstable oscillation signal from the oscillator section 5 caused by a transient control line (VR) signal.

Figure 5:
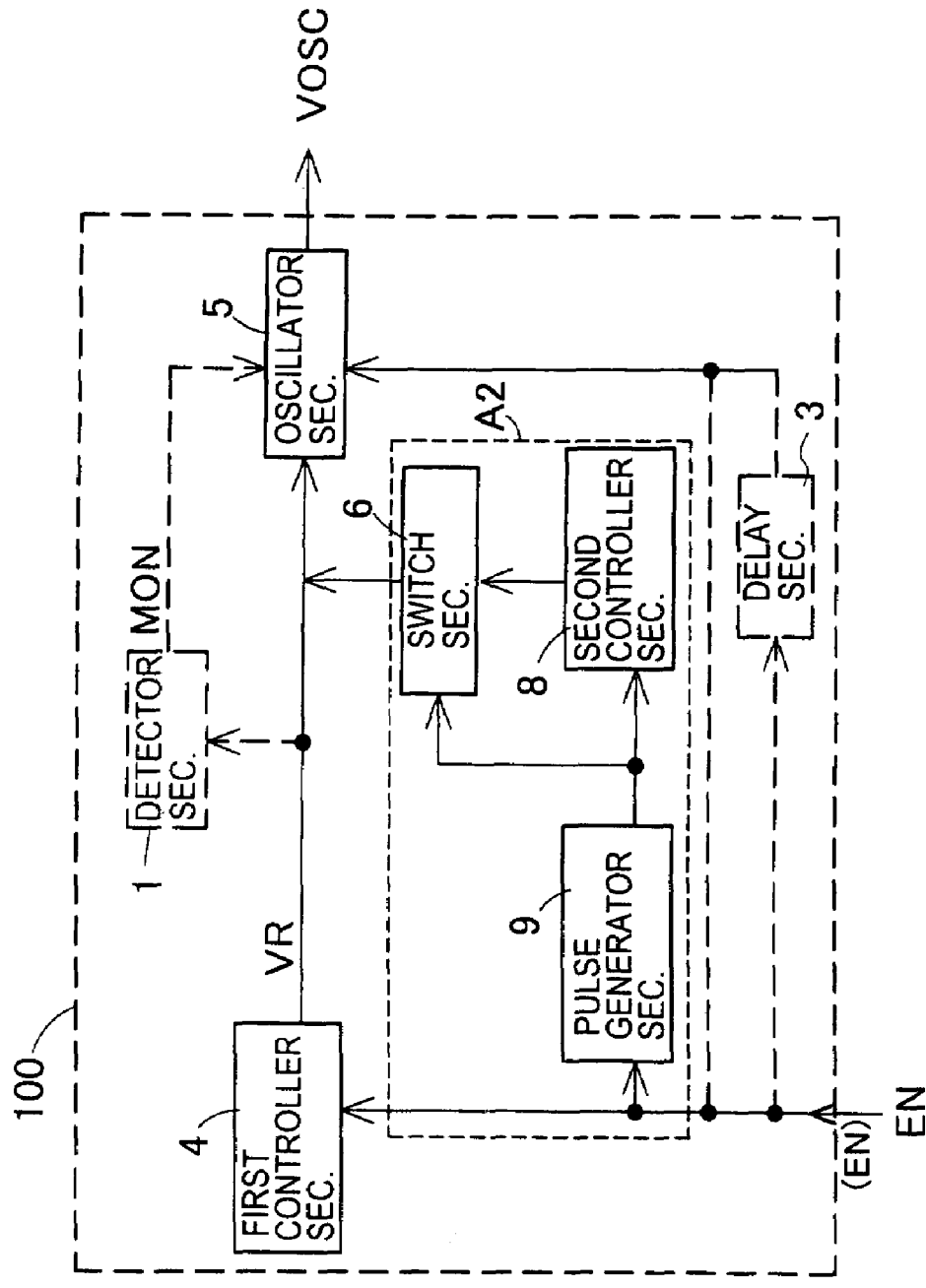
FIG. 5 is a fifth principle diagram of the present invention.

FIG. 5 is a fifth principle diagram of an oscillator circuit 100 of the present invention. A first controller section 4 is provided in place of the controller section 4 of the fourth principle diagram, and a second control section 8 is further provided in place of the signal generator section 7. Also, a pulse generator section 9 is provided in addition to the fourth principle diagram. The pulse generator section 9 outputs a pulse signal to a switch section 6 and a the second controller section 8 when an oscillation permitting signal (EN) is entered. The pulse signal is output according to an activation transition of the oscillation permitting signal (EN). By the entry of the pulse signal, the switch section 6 is made conductive, and a predetermined signal output by activation of the second control section 8 is supplied to the control line (VR).

In the fifth principle of the present invention, in order to compensate for a limited driving capability of the first controller section 4, the second controller section 8 is driven in addition to the first controller section 4 for a predetermined period from the activation transition of the oscillation permitting signal (EN), thereby increasing a driving capability until the control line (VR) reaches a set oscillation-frequency control signal (VR). It is possible to set the control line (VR) to a set oscillation-frequency control signal (VR) set within a short time with respect to the activation of the oscillation permitting signal (EN) while limiting the driving capability of the first controller section 4 and maintaining a low current consumption operation, thereby preventing outputting of an unstable oscillation signal from the oscillator section 5 caused by a transient control line (VR) signal.

Next, a description is given of the detector section 1 and the delay section 3 indicated by dotted lines in the fourth and fifth principle diagrams of the present invention. These components 1 and 3 are not essential in the fourth and fifth principle diagrams. Either one or both may be provided to further assure the elimination of the unstable operation period during activation of the oscillation permitting signal (EN).

The detector section 1 detects whether the signal of the control line (VR) has been entered and reached a signal equivalent to the set oscillation-frequency control signal (VR) or not. A result of the detection is entered as a detection signal (MON) to the oscillator section 5, and oscillating operation is controlled. By the detection signal (MON) indicating that the signal of the control line (VR) has reached the signal equivalent to the set oscillation-frequency control signal (VR), the oscillator section 5 is controlled to start oscillating operation or output an oscillation signal together with the oscillation permitting signal (EN).

The delay section 3 adds a predetermined delay time to the oscillation permitting signal (EN), and outputs it to the oscillator section 5. The predetermined delay time is set in accordance with the transient period when the signal of the control line (VR) is changed to a signal equivalent to the set oscillation-frequency control signal (VR) by the activation of the oscillation permitting signal (EN). Control is performed such that oscillating operation of the oscillator section 5 can be started or an oscillation signal can be output after the signal of the control line (VR) reaches the signal equivalent to the oscillation-frequency control signal (VR). Thus, it is possible to prevent outputting of an unstable oscillation signal from the oscillator section 5 caused by setting of the transient oscillation-frequency control signal (VR).

As another method of maintaining the detector section 1 in the inactive state, an arrangement can be made where the detector section 1 is controlled by the oscillation permitting signal (EN). By making circuit operation of the detector section 1 inactive in the inactive state, it is possible to maintain the operation of the detector section 1 stopped irrespective of the signal of the control line (VR).

Figure 6:
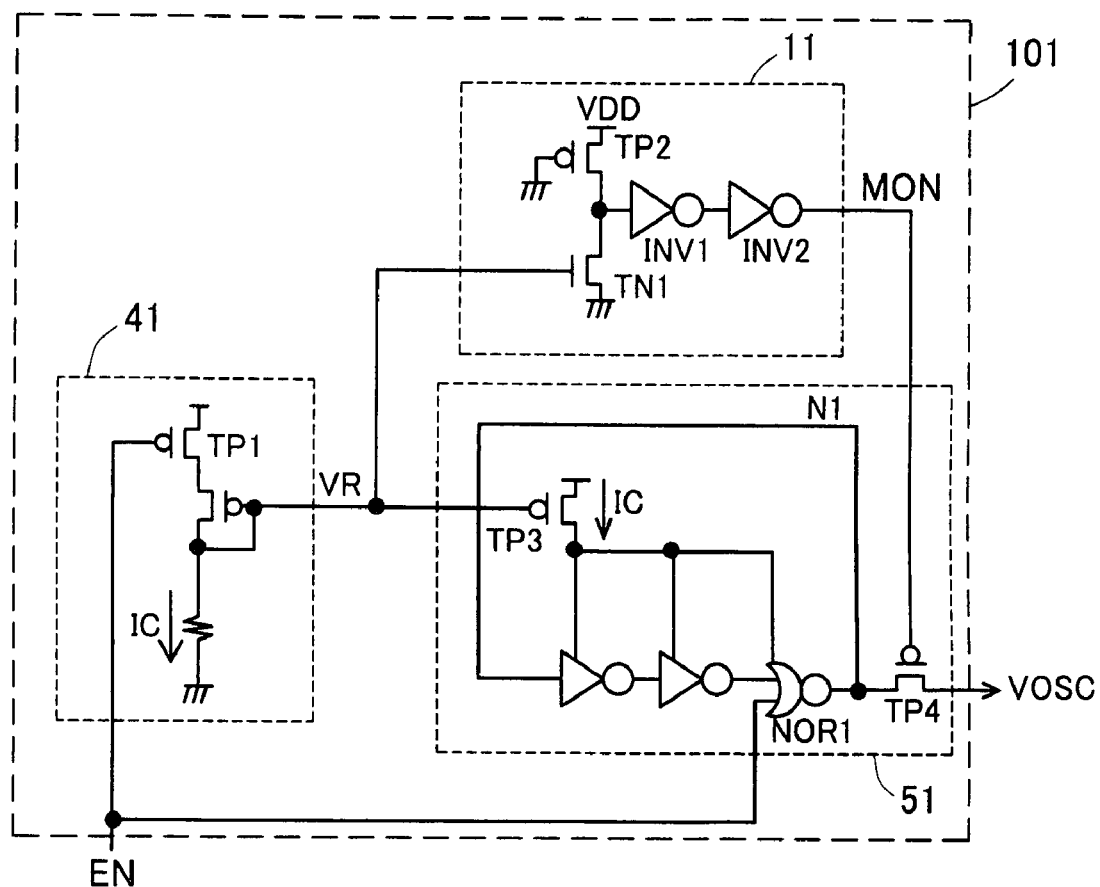
FIG. 6 shows a circuit diagram of a first embodiment.

The oscillator circuits 101 and 102 shown in FIGS. 6 to 9 are oscillator circuits of first and second embodiments of the first principle diagram (FIG. 1). FIG. 6 shows the oscillator circuit 101 of the first embodiment. A controller section 41 comprises a PMOS transistor TP1 in place of the switch element 5100 provided in the controller section 410 of the first specified example of the first prior art. An oscillator section 51 is constructed such that an oscillation signal VOSC is output from the oscillation section 54 of the second specific example of the first prior art through a PMOS transistor TP4 as a switch element. A gate terminal of the PMOS transistor TP4 is controlled by a detection signal (MON) output from a detector section 11 described later.

For the detector section 11, an oscillation-frequency control signal VR is entered into a gate terminal of an NMOS transistor TN1. A source terminal of the NMOS transistor TN1 is connected to a ground voltage VSS. A drain terminal is connected to a drain terminal of a PMOS transistor TP2 having a power source voltage VDD connected to the source terminal and a ground voltage connected to the gate terminal, and a logic inversion gate using this connection point as an output terminal is configured. A logic inversion threshold voltage of the logic inversion gate is set based on balance between conductance of the PMOS transistor TP2 and conductance of the NMOS transistor TN1, in such a way as to be logically inverted with respect to a voltage value of an oscillation-frequency control signal VR when the oscillator section 51 carries out its oscillating operation at a predetermined oscillation frequency. A voltage value which can detect reaching of the oscillation-frequency control signal VR to a predetermined voltage value is set as a threshold value beforehand, and the detection signal MON is activated in a state where the oscillation-frequency control signal VR outputs a stable voltage value. Following starting of the controller section 41, the oscillation-frequency control signal VR is increased from a ground voltage VSS to a predetermined voltage value indicating a predetermined oscillation frequency. Accordingly, by setting a given voltage value as a threshold value until a predetermined voltage value is reached, a logical inversion is securely carried out to activate the detection signal MON. An output of a logic inversion gate of an initial stage is output as a detection signal MON to the oscillator section 51 after it is subjected to waveform shaping, driving capability securing, logic matching and the like by inverter elements INV1 and INV2 of a second stage.

The oscillator section 51 includes a NOR element NOR1 in place of the final stage inverter element of the ring oscillator, wherein the NOR1 is controlled by an enable signal (EN) which is an oscillation permitting signal. In an oscillation enable state where the enable signal EN becomes a low logic level, the NOR element NOR1 functions as a logic inversion gate to configure a ring oscillator. Accordingly, oscillating operation is carried out in the oscillator section 51. On the other hand, an output of the NOR element NOR1 is output as an oscillation signal VOSC through the PMOS transistor TP4. PMOS transistor TP4 is controlled by the detection signal MON. The detection signal MON becomes a low logic level at a stage where the enable signal EN is activated to start the controller section 41, and the oscillation frequency control signal VR reaches a predetermined voltage value, and the PMOS transistor TP4 is made conductive to output the oscillation signal VOSC. The ring oscillator is configured in the oscillator section 51 to start the oscillating operation with the activation of the enable signal EN, and then the oscillation signal VOSC as an output signal is output at a point of time when the oscillation frequency reaches the predetermined frequency. The oscillating operation is carried out in these two stages. Thus, a signal of a stable predetermined oscillation frequency is output as an oscillation signal VOSC.

Figure 7:
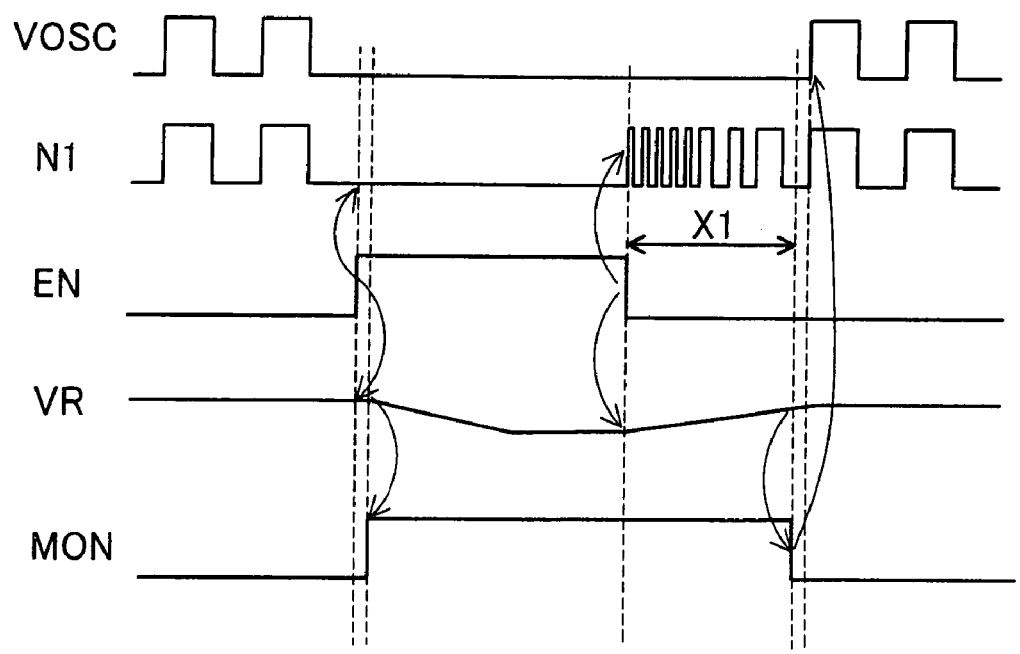
FIG. 7 shows operational waveforms of the first embodiment.

FIG. 7 shows an oscillation operational waveform. When the enables signal EN is changed to a low logic level, the controller section 41 is started, and the ring oscillator is configured in the oscillation section 51 to start oscillating operation. With the starting of the controller section 41, the oscillation-frequency control signal VR is gradually increased from the ground voltage VSS to the predetermined voltage value. However, since its voltage is lower than the predetermined voltage value in this transient period (X1 in FIG. 7), a control current IC to the ring oscillator becomes larger compared with that in the stable state. Thus, the ring oscillator is oscillated at a high frequency (node N1). However, since the detection signal MON is inactive, and the PMOS transistor TP4 is in a nonconductive state, no high-frequency oscillation signals are output to the oscillation signal VOSC. Then, the detector section 11 detects that the oscillation-frequency control signal VR has reached the predetermined voltage value, and the detection signal MON is inverted. At this point, the PMOS transistor TP4 is made conductive, and an oscillation signal of the ring oscillator which oscillates stably at a predetermined oscillation frequency is output as an oscillation signal VOSC.

Figure 8:
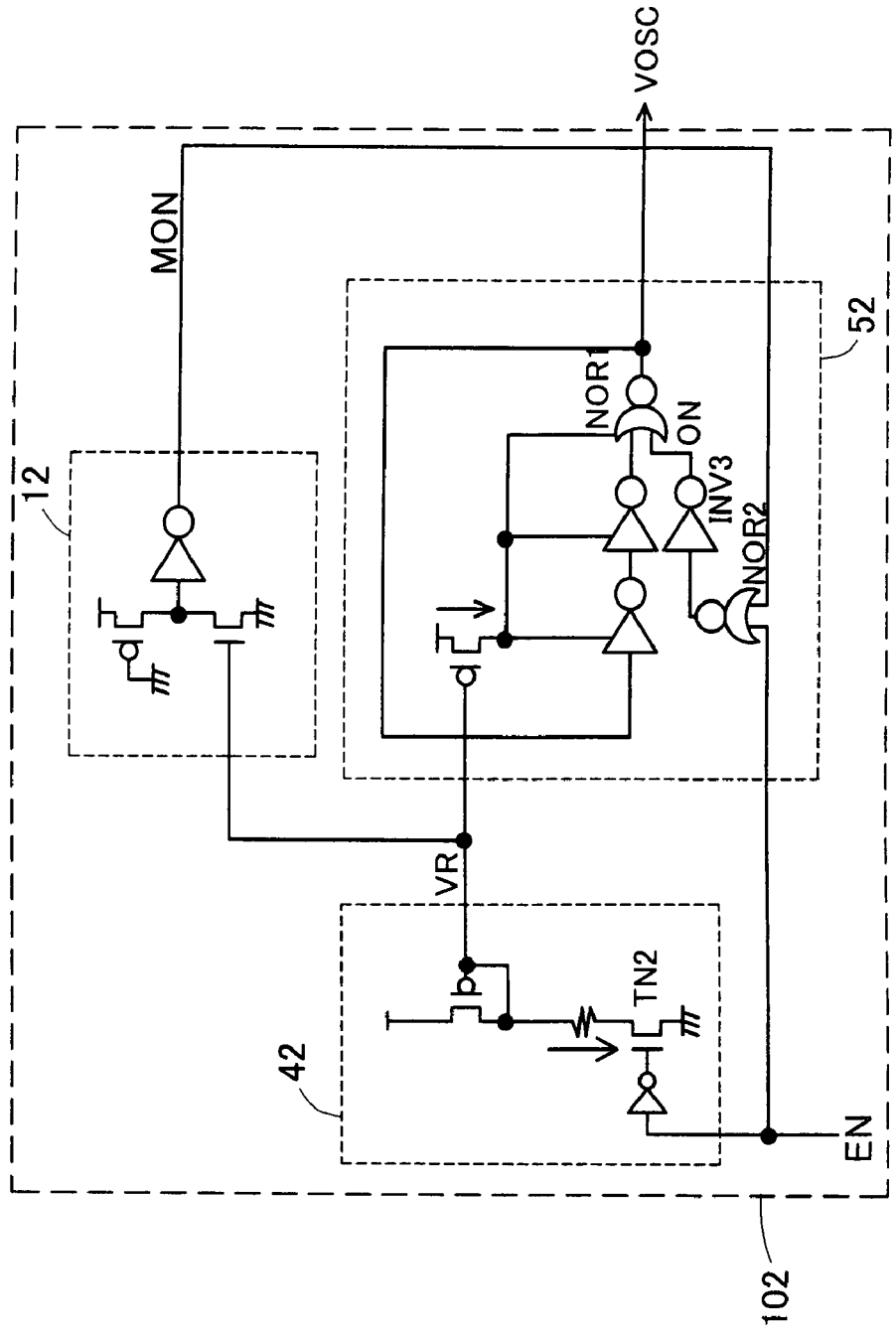
FIG. 8 shows a circuit diagram of a second embodiment.

FIG. 8 shows the oscillator circuit 102 of the second embodiment. In place of the controller section 41 of the first embodiment, a controller section 42 is provided, which comprises an NMOS transistor TN2 in place of the switch element 5102 provided in the PMOS transistor TP4 in the oscillator section 51 of the first embodiment is removed, and an oscillation starting signal ON is entered into a NOR element NOR1 through a NOR element NOR2 and an inverter element INV3, to which an enable signal EN and the detection signal MON are entered. An oscillation signal VOSC is configured to be output from the NOR element NOR1.

A detector section 12 is constructed in such a manner that the inverter element INV2 in the detector section 11 of the first embodiment is removed, and a low-active detection signal MON is output. At an initial stage of the detector section 12, a logic inversion gate similar to that of the initial stage of the detector section 11 is provided. Following the starting of the controller section 42, an oscillation-frequency control signal VR is reduced from a high voltage level to a predetermined voltage value indicating a predetermined oscillation frequency. Accordingly, by setting a predetermined voltage value as a threshold value until the predetermined voltage value is reached, a logic inversion is surely carried out to activate the detection signal MON. Since the controller section 42 is operated having a polarity reverse to that of the controller section 41 of the first embodiment. Accordingly, the detector section 12 comprises inverter elements one stage less than the detector section 11 of the first embodiment.

Figure 9:
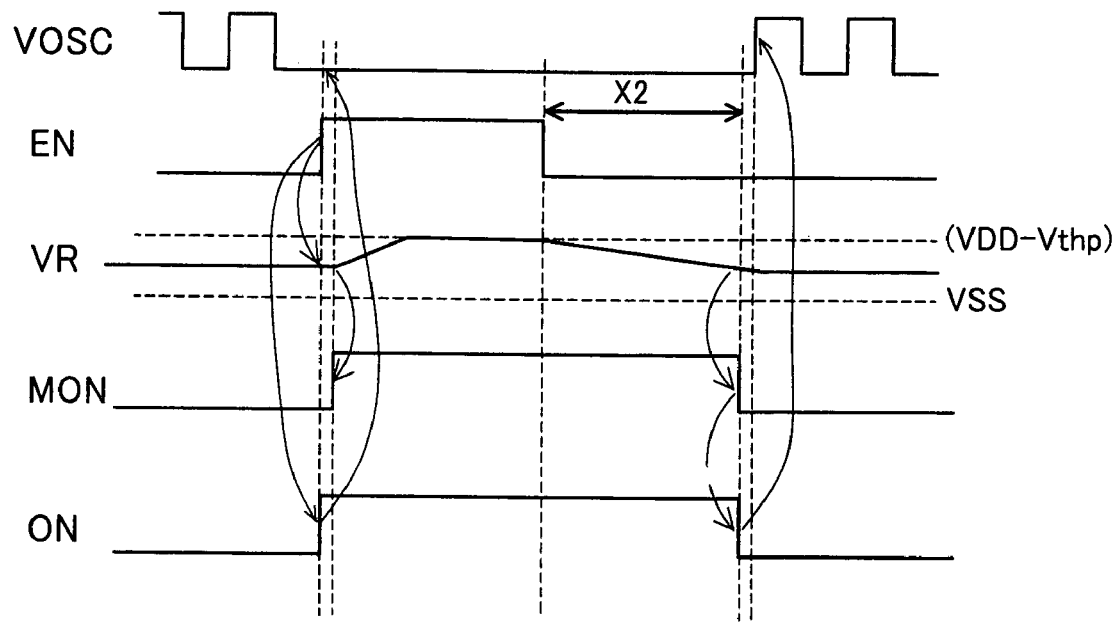
FIG. 9 shows operational waveforms of the second embodiment.

FIG. 9 shows an oscillation operational waveform. When the enable signal EN is changed to a low logic level, the controller section 42 is started, and oscillation-frequency control signal VR is gradually reduced from a high voltage level (VDD−Vthp) which is lowered from a power source voltage VDD by a threshold voltage Vthp of the PMOS transistor to the predetermined voltage value. However, since its voltage is higher than the predetermined voltage value in this transient period (X2 in FIG. 9), a control current IC to the ring oscillator is smaller compared with that in the stable state. As the detector section initial stage is not inverted at this time, the detection signal MON maintains its high logic level, and the oscillation signal VOSC is fixed at a low level through the NOR element NOR2. That is, the oscillating operation of the ring oscillator is stopped, while the oscillation signal VOSC is fixed at a low level. Then, the detector section 12 detects that the oscillation-frequency control signal VR has reached the predetermined voltage value, and the detection signal MON is inverted to a low logic level. At a point of this time, an input signal of the NOR element NOR2 also becomes low in logic level, an output is inverted to a high logic level, and the NOR element NOR1 functions as a logic inversion gate to start oscillation operation of the ring oscillator. A this time, since the oscillation-frequency control signal VR has reached the predetermined voltage value, the oscillating operation is carried out stably at a predetermined oscillation frequency, and a stable oscillation output is output as an oscillation signal VOSC.

As described above, according to the first and second embodiments, it is possible to perform oscillating operation at a desired oscillation frequency set by the oscillation-frequency control signal VR according to the detection signal MON which is a detection result of each of the detector sections 11 and 12. Even in the transient period (X1 in FIG. 7, or X2 in FIG. 9) when the oscillation-frequency control signal VR from each of the controller sections 41 and 42 which start operation by the enable signal EN as the oscillation permitting signal is unstable, it is possible to perform oscillation at a stable oscillation frequency without any instability in the oscillation operation.

In the initial stage circuits of the detector sections 11 and 12, by comparing the signal value of the oscillation-frequency control signal VR with that of the predetermined frequency, it is possible to set the oscillation frequencies at the oscillator sections 51 and 52 as predetermined frequencies.

The oscillation-frequency control signal VR which is an analog voltage value can be detected by the logic inversion gate of the initial stage circuit of each of the detector sections 11 and 12 having the signal value corresponding to the predetermined oscillation frequency set as a threshold voltage. The detection signal MON can be taken out as a digital signal. Processing such as oscillation starting in the later stage oscillator sections 51 and 52 can be carried out by the digital signal. Thus, high-speed processing can be carried out in a small circuit by low current consuming operation.

As the NOR element NOR1 of the oscillator section 51, and the NOR element NOR2 of the oscillator section 52 as signal composing sections, the enable signal EN which is the oscillation permitting signal is logically composed with the detection signal MON and is output. Thus, upon detection that both signals are at low logic levels, it is possible to control the NOR element NOR1 constituting the final stage of the ring oscillator as operation control unit.

Figure 10:
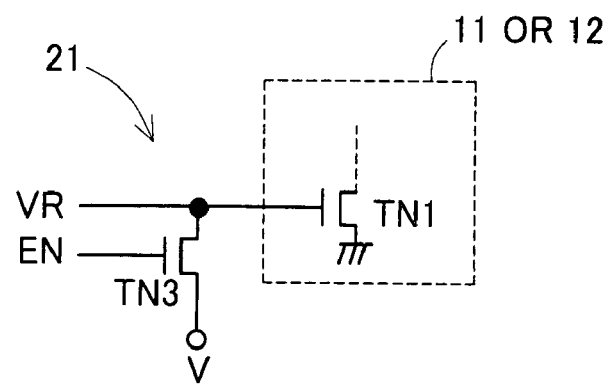
FIG. 10 shows a circuit diagram of a third embodiment (clamp section)
Figure 11:
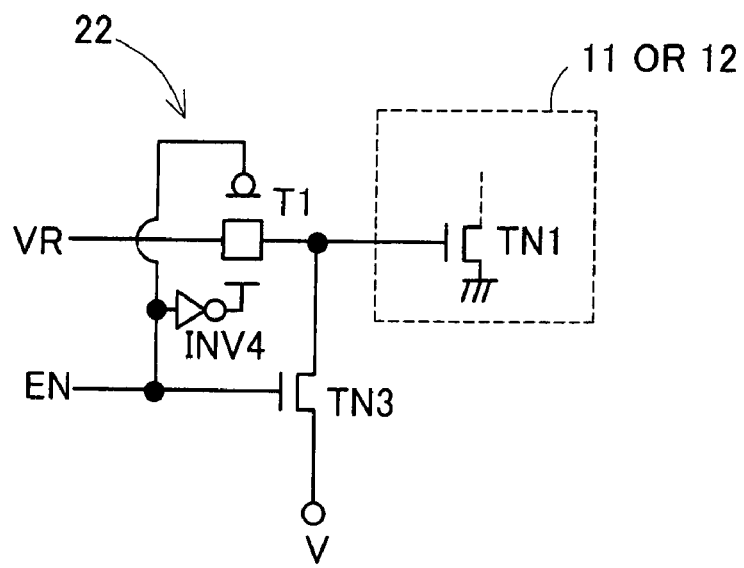
FIG. 11 shows a circuit diagram of a fourth embodiment (clamp section)
Figure 12:
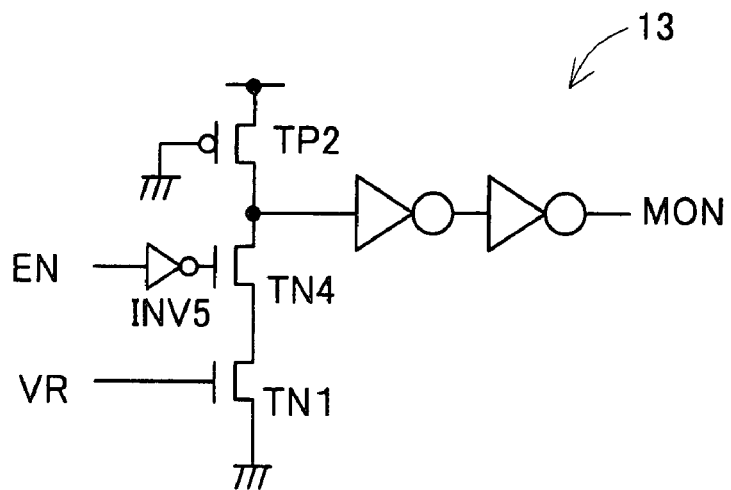
FIG. 12 shows a circuit diagram of a fifth embodiment (detector section)

FIGS. 10 to 12 show third to fifth embodiments corresponding to the second principle diagram (FIG. 2). A clamp section 21 is shown in the third embodiment of FIG. 10. An NMOS transistor TN3 is provided between an oscillation-frequency control signal VR entered into a detector section 11 or 12, and a predetermined voltage V, which is controlled by an enable signal EN. Here, a case of a low active enable signal EN is exemplified. That is, when the enable signal EN becomes a low logic level to be set in an oscillation enable state, the NMOS transistor TN3 is made nonconductive, and the oscillation-frequency control signal VR generated by a controller section 4 is entered into the detector section 11 or 12 to conduct a detecting operation. When the enable signal EN becomes a high logic level to be set in an oscillation inhibiting state, the NMOS transistor TN3 is made conductive, and the oscillation-frequency control signal VR is clamped at a predetermined voltage V. Here, since the predetermined voltage V is set to a voltage before logic inversion in an initial stage circuit of the detector section 11 or 12, no detection signal MON is output. Specifically, in the first embodiment where the oscillation-frequency control signal VR becomes a ground voltage VSS in the oscillation inhibiting state, a predetermined voltage V may be set for the ground voltage VSS. In the second embodiment where the oscillation-frequency control signal VR becomes a high voltage (VDD−Vthp) in the oscillation inhibiting state, a predetermined voltage (VDD−Vthp) or a higher voltage may be set.

A clamp section 22 is shown in the fourth embodiment of FIG. 11. In addition to the clamp section 21 of the third embodiment, a transfer gate T1 is provided for shutting off an input terminal of a detector section 11 or 12, and an output terminal of a controller section 4 for outputting an oscillation-frequency control signal VR. A low active enable signal EN is entered into a gate terminal of a PMOS transistor of the transfer gate T1, and the enable signal EN is inverted by an inverter element INV4 and entered into a gate terminal of the NMOS transistor. When the enable signal EN becomes a low logic level to be set in an oscillation enable state, the NMOS transistor TN3 is made nonconductive, and the transfer gate T1 is made conductive to enter the oscillation-frequency control signal VR into the detector section 11 or 12, thereby starting detecting operation. When the enable signal EN becomes a high logic level to be set in an oscillation inhibiting state, the NMOS transistor TN3 is made conductive, and the transfer gate T1 is made nonconductive to clamp the input terminal of the detector section 11 or 12 at a predetermined voltage V.

A detector section 13 is shown in the fifth embodiment of FIG. 12. The detector section 13 has circuitry where activation and inactivation are switched according to an enable signal EN. An NMOS transistor TN4 is added to the initial stage circuit of the detector section 11 of the first embodiment. The NMOS transistor TN4 is connected between an NMOS transistor TN1 and an output terminal of the initial stage circuit, and the enable signal EN is inverted by an inverter element INVS and entered into a gate terminal. When the enable signal EN becomes a low logic level to be set in an oscillation enable state, the NMOS transistor TN4 is made conductive, and the initial stage circuit is activated, thereby executing detecting operation. When the enable signal EN becomes a high logic level to be set in an oscillation inhibiting state, the NMOS transistor TN4 is made nonconductive, and an output terminal of the initial stage circuit is fixed at a power source voltage VDD, thereby preventing detecting operation from being executed.

In the detector section 13 of the fifth embodiment, the circuitry corresponding to the detector section 11 was exemplified. However, circuitry corresponding to the detector section 12 of the second embodiment can be employed. In this case, in place of the NMOS transistor TN4 of the detector section 13, a PMOS transistor may be inserted between the PMOS transistor TP2 and the output terminal of the initial stage circuit, and the enable signal EN may be entered into the gate terminal. When the enable signal EN becomes a low logic level to be set in an oscillation enable state, the newly connected PMOS transistor is made conductive to carry out detecting operation. When the enable signal EN becomes a high logic level to be set in an oscillation inhibiting state, the newly connected PMOS transistor is made nonconductive, and the output terminal of the initial stage circuit is fixed at a ground voltage VSS, and no detecting operation is carried out.

As described above, according to the third and fourth embodiments, it is possible to maintain the oscillation-frequency control signal VR at a signal value other than a signal value corresponding to a predetermined oscillation frequency, stop the detecting operation at the detector section 11 or 12, and keep oscillation outputting stopped.

Also, in this case, if a predetermined clamp value is set to a ground voltage VSS in the constitution of the first embodiment, and to a higher voltage level such as a power source voltage (VDD−Vthp) in the constitution of the second embodiment, it is possible to surely stop the detecting operation at the detector section 11 or 12, and keep oscillation outputting stopped.

According to the fifth embodiment, since the circuit operation of the detector section 13 itself can be made inactive by the enable signal EN, it is possible to reduce unnecessary current consumption in the oscillation inhibiting state.

Figure 13:
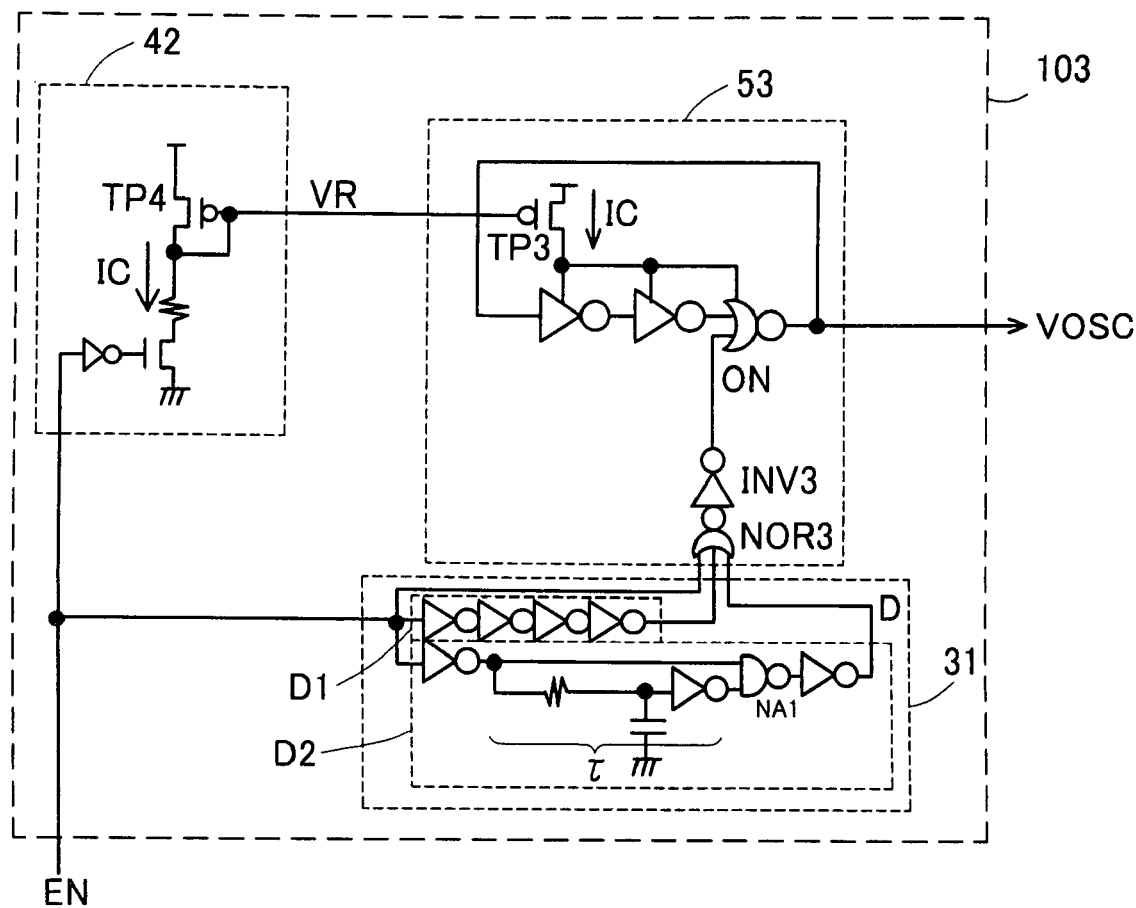
FIG. 13 shows a circuit diagram of a sixth embodiment.

FIG. 13 shows an oscillator circuit 103 corresponding to a sixth embodiment of the third principle diagram (FIG. 3). A delay section 31 is provided in place of the detector section 12 in the oscillator circuit 102 of the second embodiment. At an oscillator section 53, a 3-input NOR element NOR3 is provided in place of the 2-input NOR element NOR2 at the oscillator section 52. An enable signal EN is directly entered into each input terminal of the NOR element NOR3, and delay signals from first delay section D1 and second delay section D2 of the delay section 31 each are also entered.

The first delay section D1 comprises inverter elements of even stages (4-stage in FIG. 13) connected in series. The second delay section D2 constitutes a delay circuit for timing a predetermined delay time after the enable signal EN is changed to a low level. The enable signal EN is inverted by the inverter element, and entered into one input terminal of a NAND element NA1. A signal delayed for a predetermined delay time is entered into the other input terminal through a delay unit T comprised of an inverter element or a CR delay element. Here, a logic level between an input and an output of the delay unit T is inverted. Accordingly, at the output terminal logic-inverted by the inverter element from the output of the NAND element A1, a high-level pulse signal having a pulse width of a predetermined delay time set by the delay unit T with respect to the transition of the enable signal EN to the low level is obtained as a delay signal D.

Since there is a delay time on the circuit between the low level transition of the enable signal EN to the high level transition of the delay signal D, there is a possibility that low-level hazard may occur from the inverter element INV3. The first delay section D1 is provided to deal with this hazard. That is, by the delay signal of the first delay section D1, a high-level signal is entered into at least one input terminal of the NOR element NOR3 during the delay time on the circuit from the low level transition of the enable signal EN, making it possible to prevent the hazard.

Figure 14:
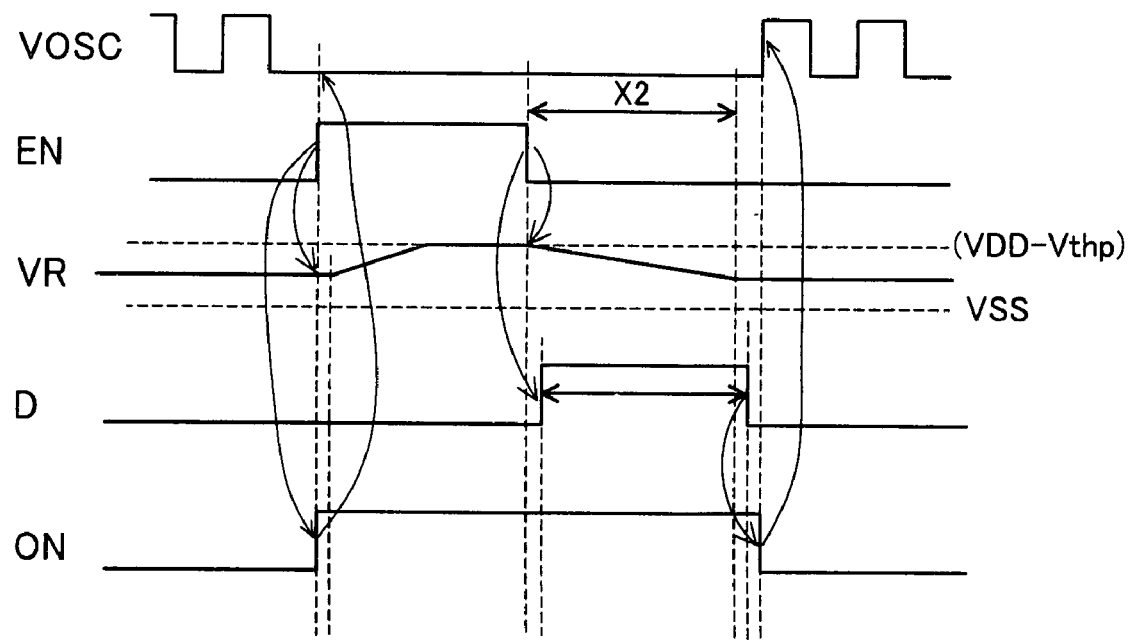
FIG. 14 shows operational waveforms of the sixth embodiment

FIG. 14 shows an operational waveform at the start of oscillating operation. When the enable signal EN is changed to a low level, the controller section 42 is started, and an oscillation—frequency control signal VR is gradually reduced from a high voltage level (VDD−Vthp) to a predetermined voltage value. However, since the oscillation-frequency control signal VR is higher than the predetermined voltage value in this transient period (X2 in FIG. 14), control current IC to the ring oscillator is smaller compared with that in a stable state. Accordingly, to keep oscillating operation stopped in this period, a high-level delay signal D is output by the second delay section D2 following the delay time of the first delay section D1 at the delay section 31. Thus, at least one input terminal of the NOR element NOR3 of the oscillator section 53 is maintained at a high level, and an oscillation starting signal ON at a high level. Therefore, the ring oscillator of the oscillator section 53 is not operated. This period is continued by maintaining the delay signal D at a high level during the predetermined delay time set by the delay unit T of the second delay section D2. When the delay signal D is inverted to a low level after the predetermined delay time, since signals having been entered into the other input terminals of the NOR element NOR3 are also at low level, the oscillation starting signal ON is inverted to a low level to start oscillating operation at the oscillator section 53, thereby outputting an oscillation signal VOSC. By setting the predetermined delay time after a point of time when the oscillation-frequency control signal VR reaches the predetermined voltage, the oscillating operation is carried out at a stable predetermined oscillation frequency, and an oscillation signal VOSC is output as a stable oscillation output.

As described above, according to the sixth embodiment, it is possible to set a time when a signal value of the oscillation frequency control signal VR from the controller section 42 which starts operation by the enable signal EN as an oscillation permitting signal is stabilized as a predetermined delay time in the second delay section D2 of the delay section 31, and obtain a stable oscillation signal VOSC after the point of time when the oscillation-frequency control signal VR is stabilized and reaches the signal value corresponding to the predetermined oscillation frequency.

Also, here, the CR delay circuit or the like constituting the delay unit at the second delay section D2 is set corresponding to a time constant of the CR delay circuitry comprising a resistance component such as a current path of the control current IC at the controller section 42, and capacitive components such as gate capacitors of the PMOS transistors TP1 and TP3. Accordingly, time equivalent to the time for which the oscillation-frequency control signal VR reaches a stable state can be timed by the delay section 31. Thus, it is possible to time a predetermined delay time by an optimal timing at the delay section 31.

According to the first, second and sixth embodiments described above, the outputting of the oscillation signals VOSC from the oscillator sections 51 to 53 can be controlled by any one of the unit, i.e., actuation/stoppage of the oscillating operation of the ring oscillator by the NOR element NOR1 as the operation control unit, and output/stoppage of the oscillation signal VOSC by the PMOS transistor TP4 as the output control unit, or control can be made by using both of these two unit.

If as in the case of the oscillator section 51 of the first embodiment, a two-stage arrangement is made where the enable signal EN activates the NOR element NOR1 to start oscillating operation, and then the detection signal MON activates the PMOS transistor TP4 to output an oscillation signal VOSC, the oscillating operation of the ring oscillator by the enable signal EN can be started before the oscillation signal VOSC is output by the detection signal MON, and the oscillating operation at the oscillator section 51 can be stabilized when the oscillation signal VOSC is output. Moreover, this two-stage arrangement can be similarly applied to the oscillator section 52 of the second embodiment and the oscillation section 53 of the sixth embodiment.

Figure 22:
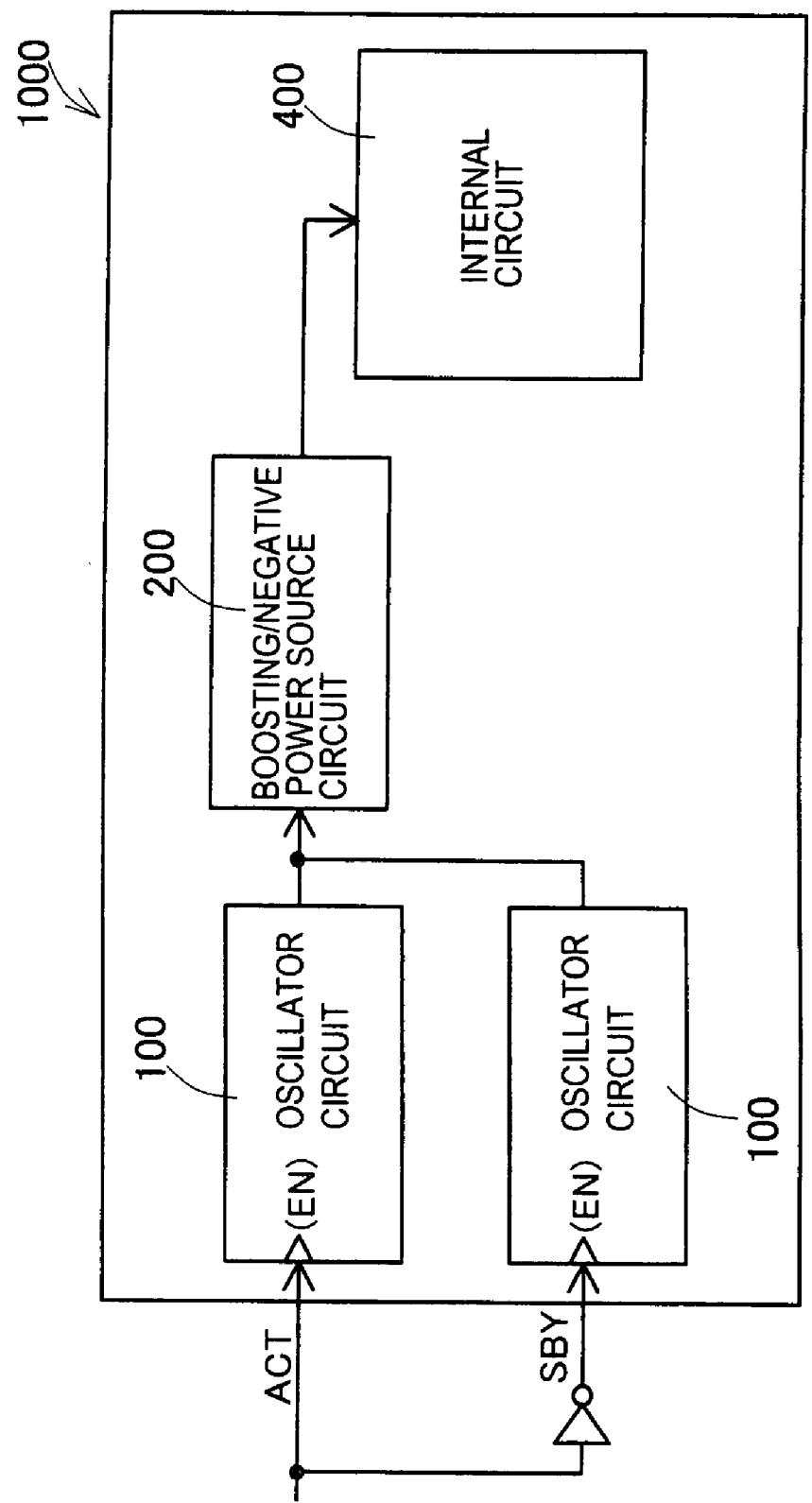
FIG. 22 shows a circuit diagram of a semiconductor device including oscillator circuits.
Figure 23:
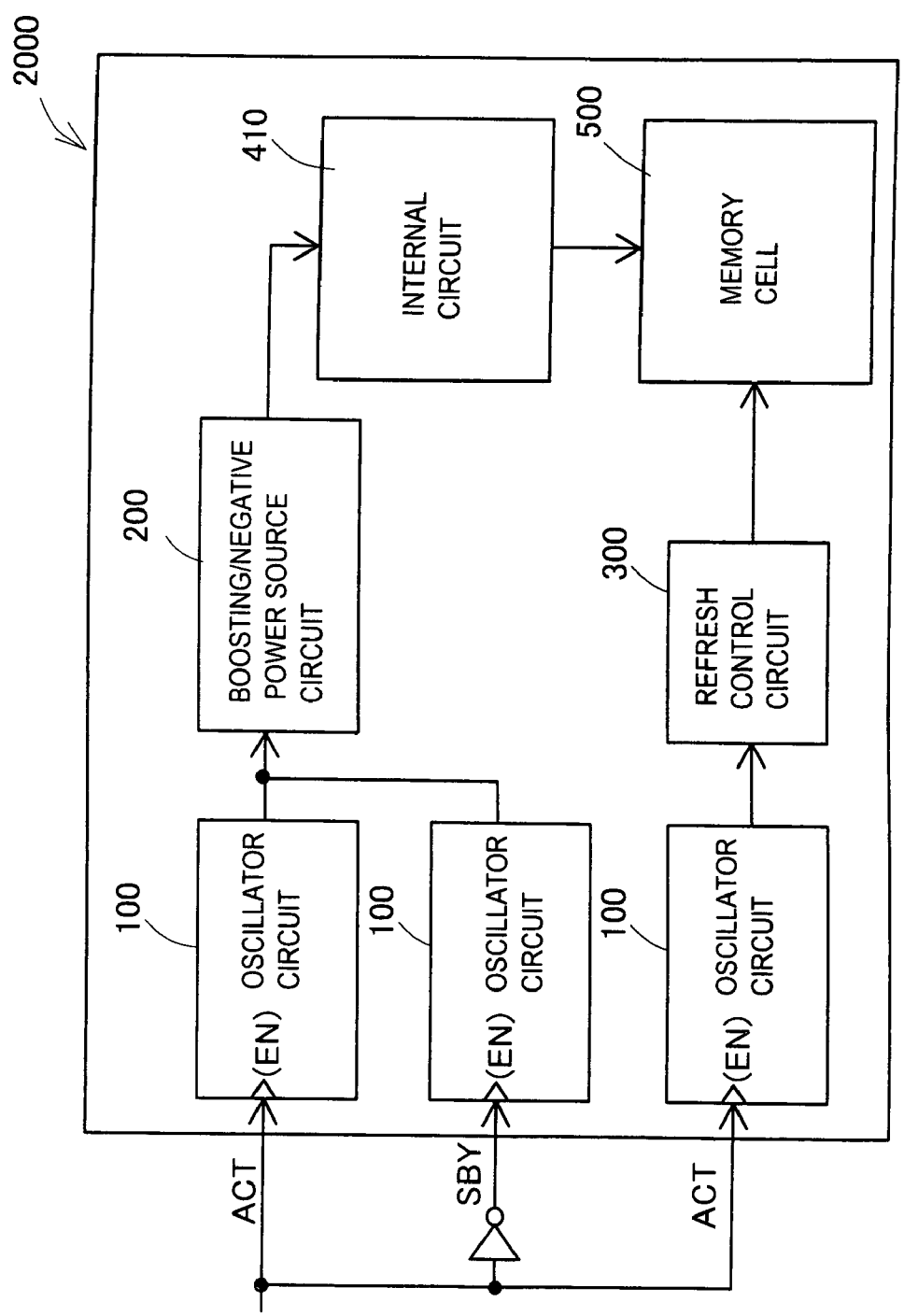
FIG. 23 shows a circuit diagram of a semiconductor memory device including oscillator circuits.
Figure 24:
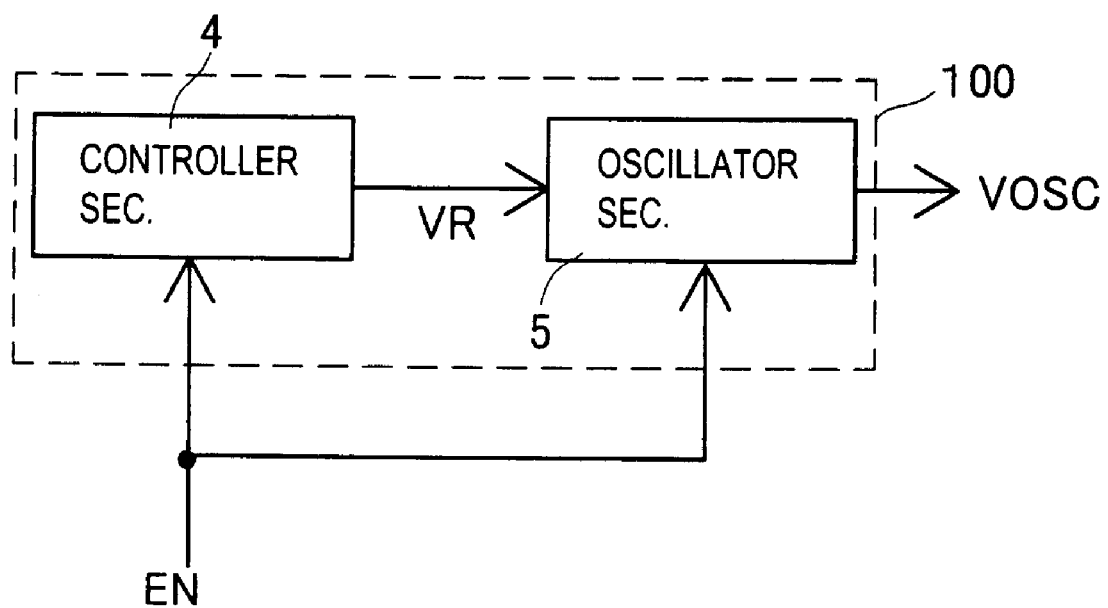
FIG. 24 shows circuit block diagram of a first prior art.
Figure 25:
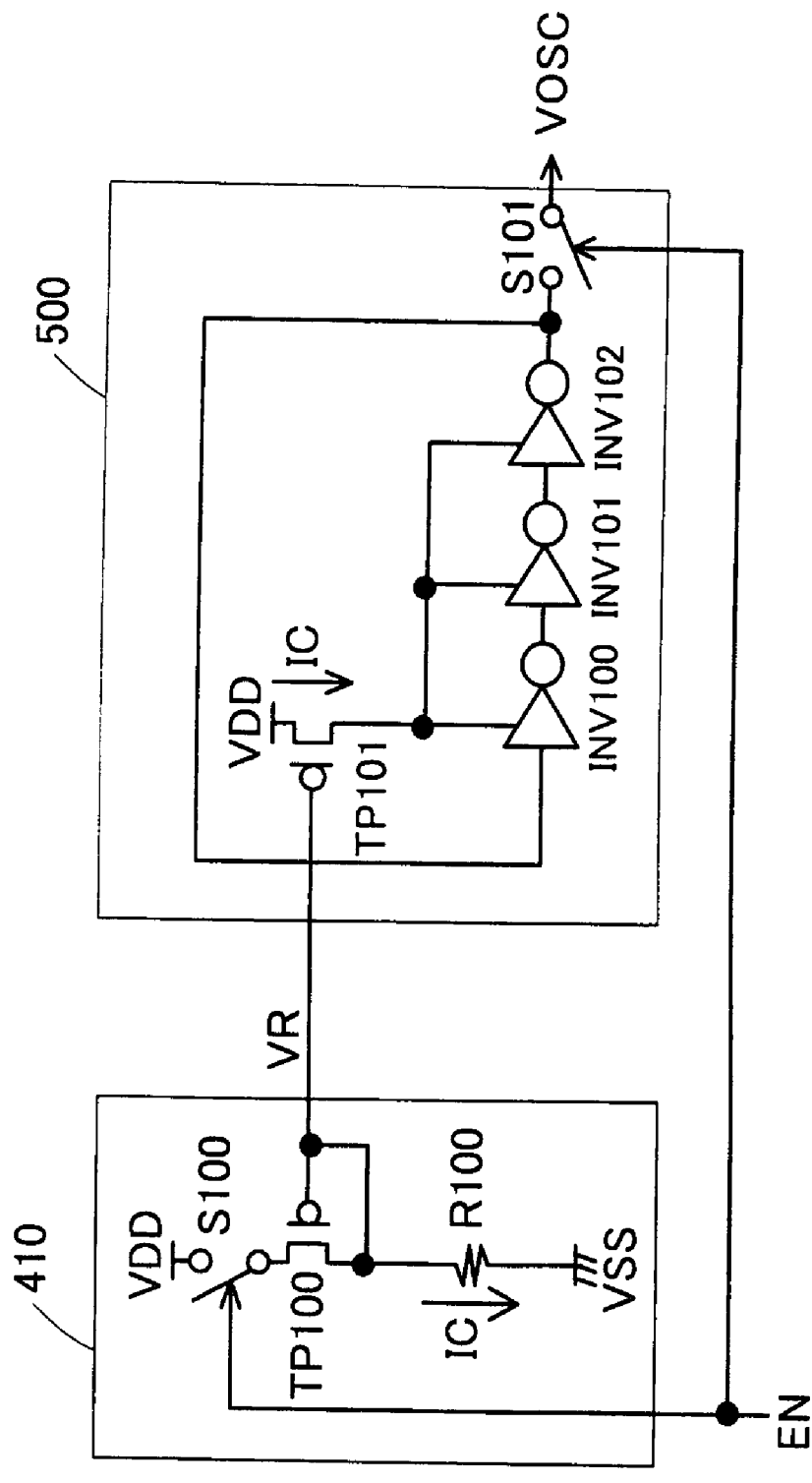
FIG. 25 shows a circuit diagram of a first specific example of the first prior art.
Figure 26:
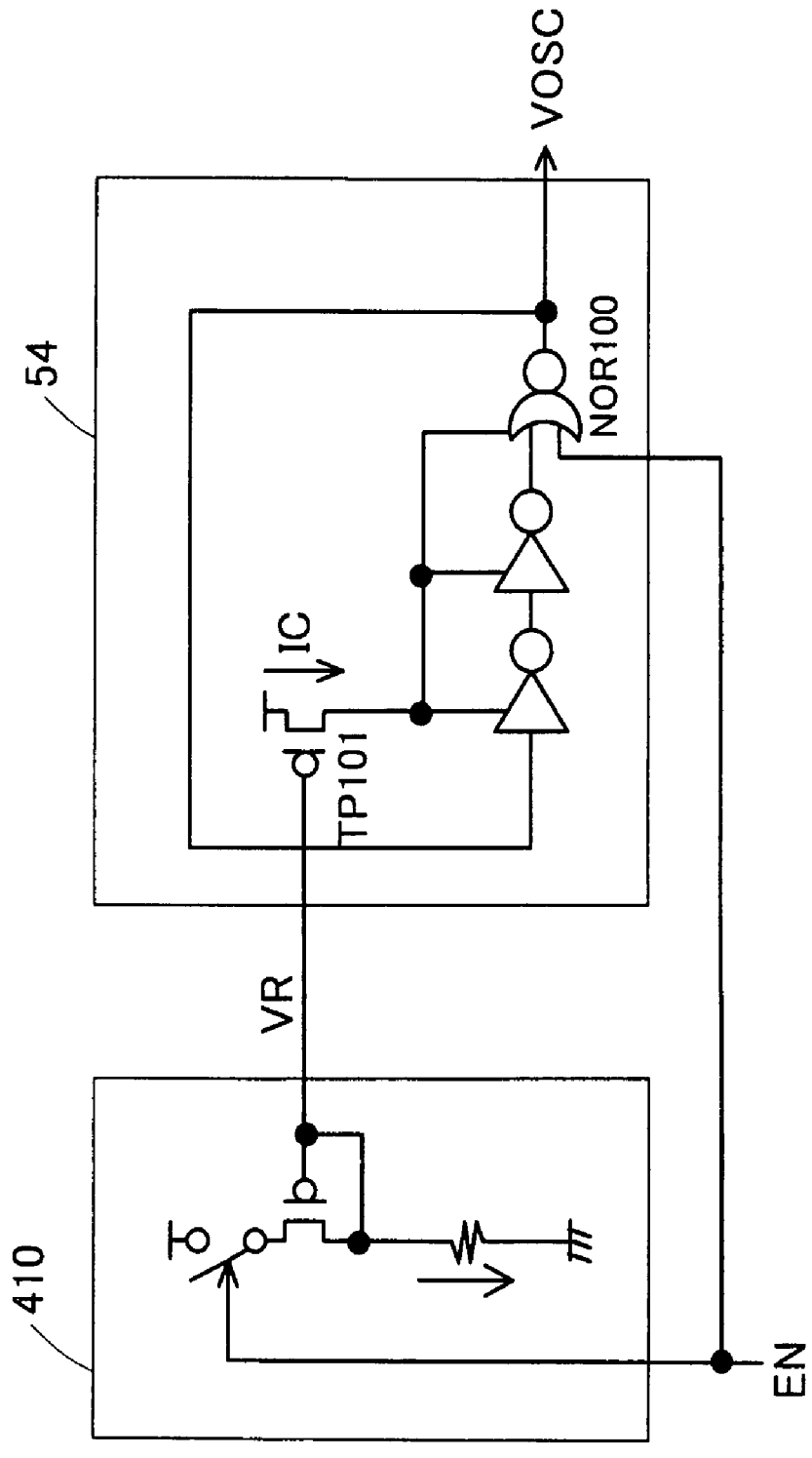
FIG. 26 shows a circuit diagram of a second specific example of the first prior art.
Figure 27:
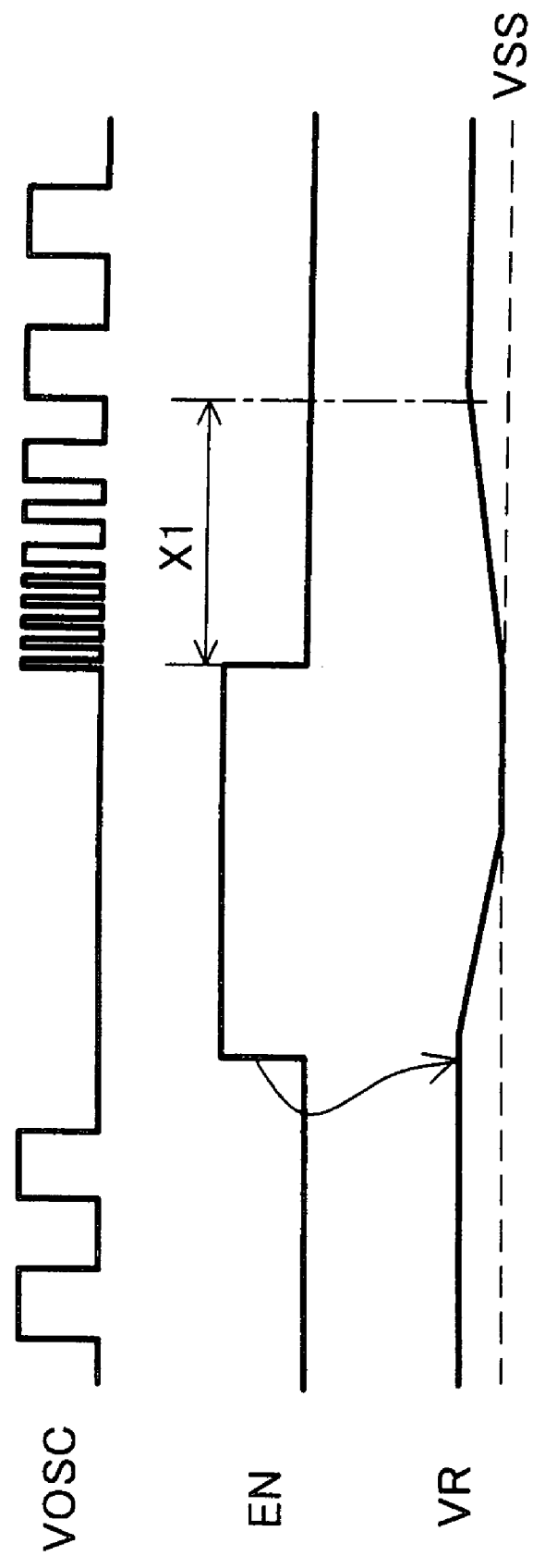
FIG. 27 shows operational waveforms of the first and second specific examples of the first prior art.
Figure 28:
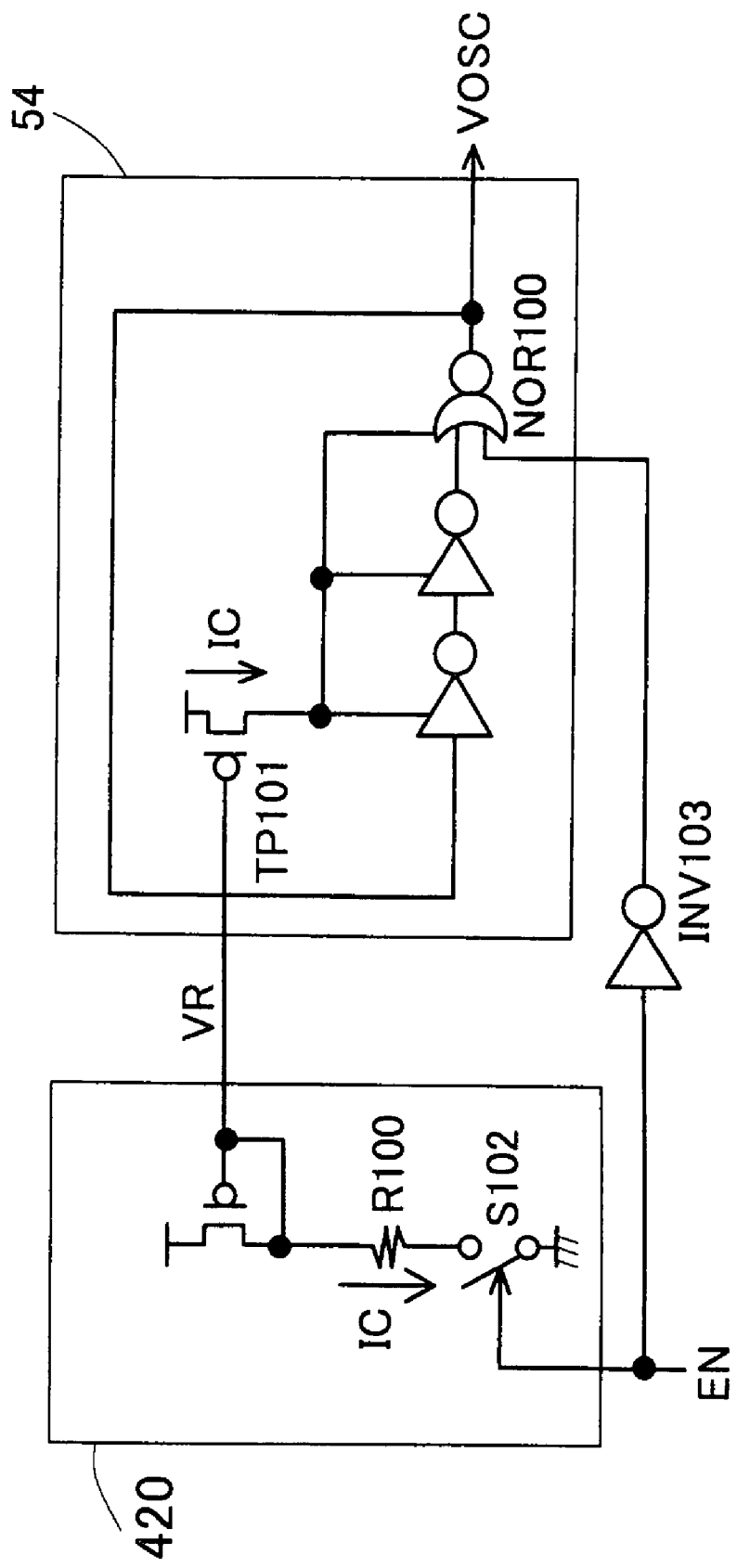
FIG. 28 shows a circuit diagram of a third specific example of the first prior art.
Figure 29:
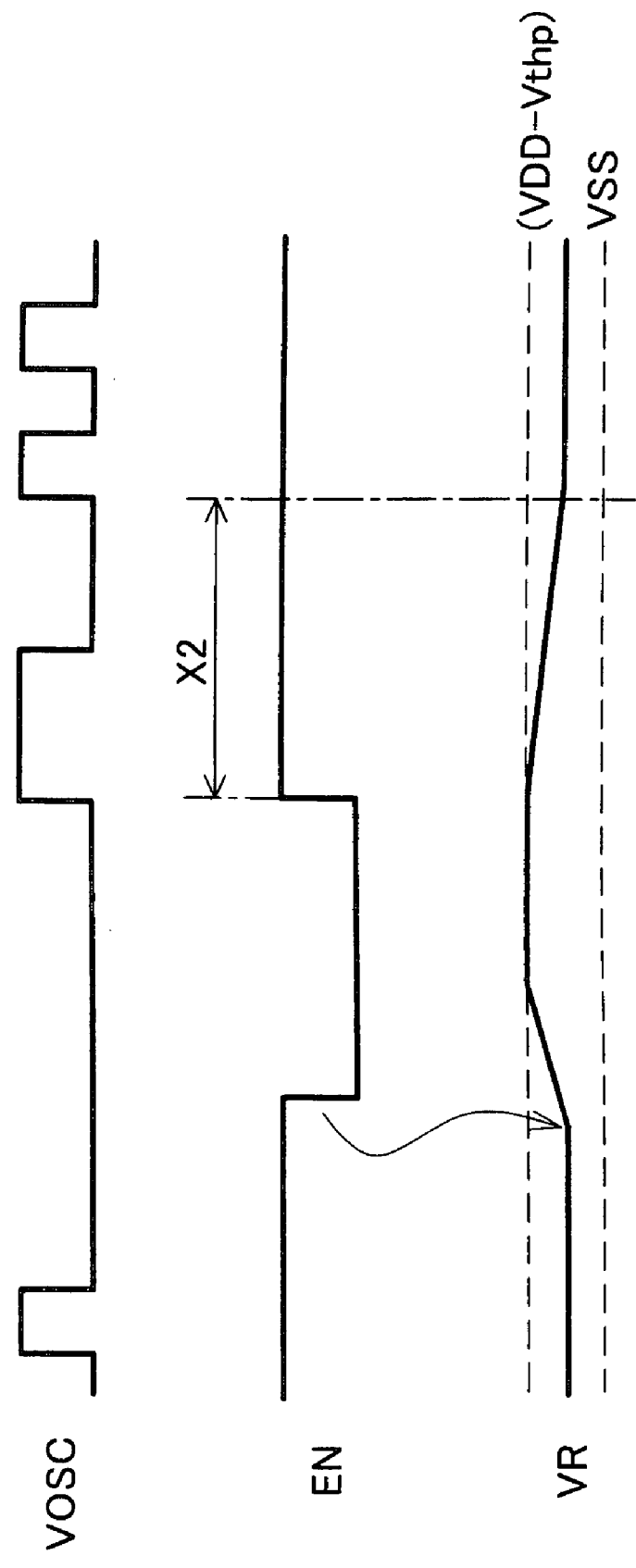
FIG. 29 shows operational waveforms of the third specific example of the first prior art.
Figure 30:
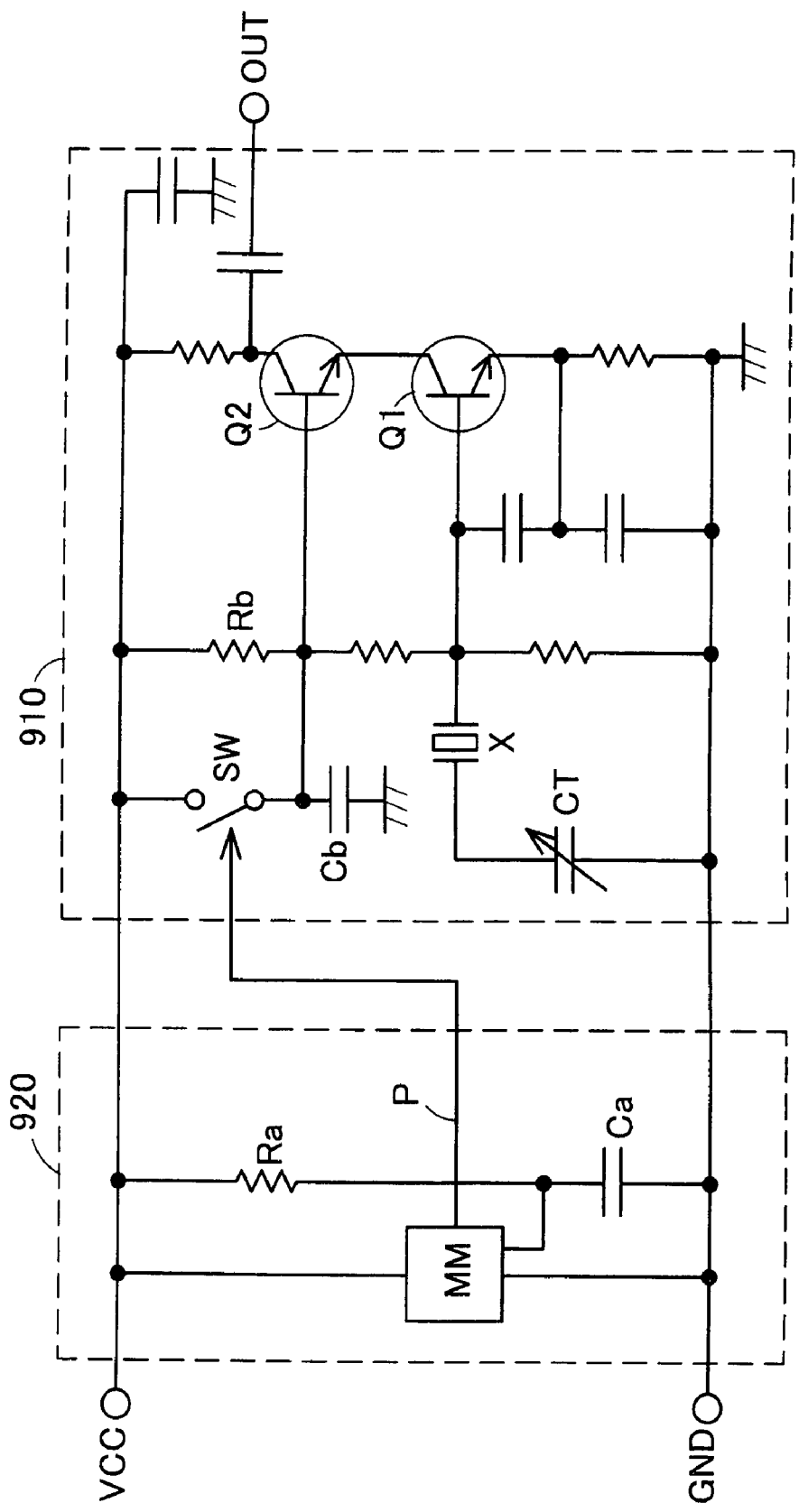
FIG. 30 shows a circuit diagram of a second prior art.
Figure 31:
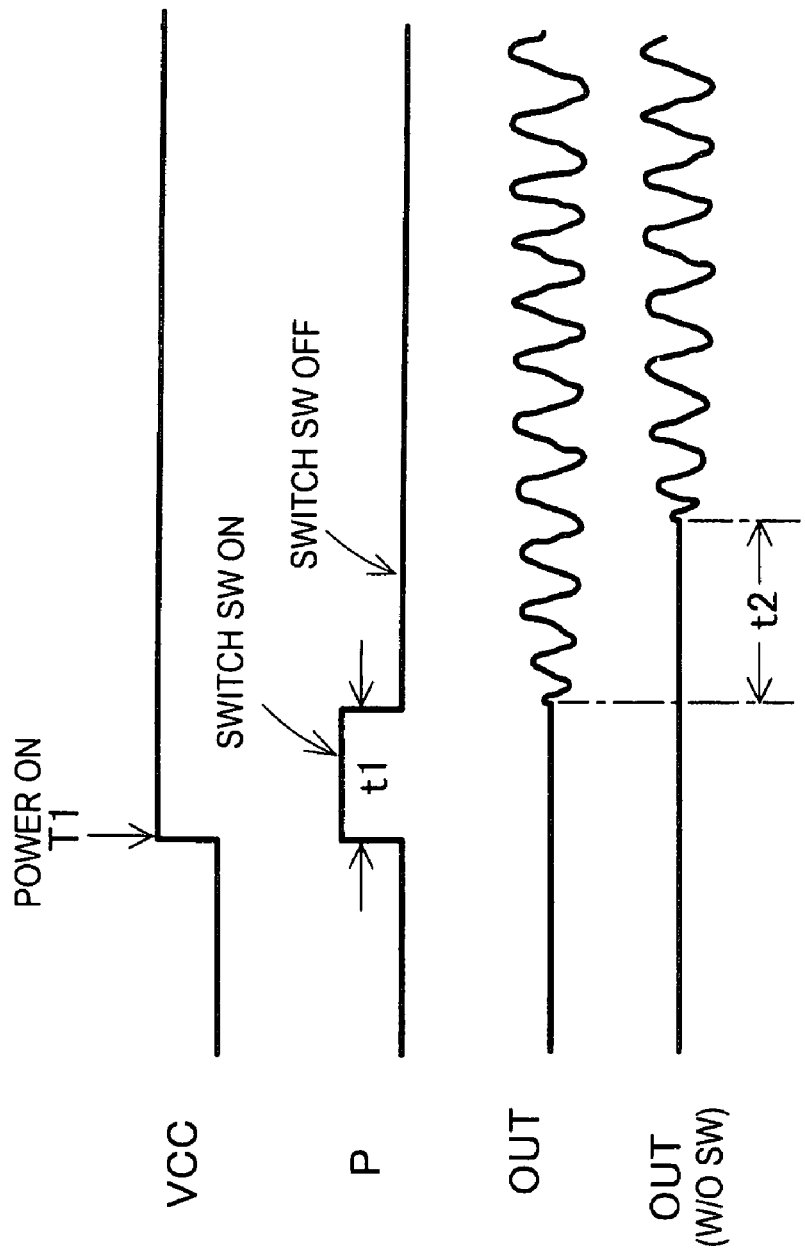
FIG. 31 shows operational waveforms of the second prior art.

By providing the foregoing oscillator circuit in place of the oscillator circuit 100 in the semiconductor device 1000 (FIG. 22) or the semiconductor memory device 2000 (FIG. 23), the semiconductor device 1000 or the semiconductor memory device 2000 can stably generate a voltage corresponding to the oscillation signal VOSC output from the oscillator circuit 100 at the boosting/negative power source circuit 200 or a voltage generator circuit. At: the refresh control circuit 300, control can be made in a stable refresh cycle according to the oscillation signal VOSC output from the oscillator circuit 100.

Thus, in the transient period when the oscillation-frequency control signal VR from each of the controller sections 41 and 42 which start operation by the enable signal EN is not stable, it is possible to perform stable circuit operation without outputting any unstable oscillation signals VOSC to the boosting/negative power source circuit 200 or the refresh control circuit 300.

Specifically, it is possible to prevent large current consumption caused by the output of an unstable high-frequency oscillation signal VOSC, erroneous operations caused by the following reduction in power source voltage, a reliability problem in the semiconductor device 1000 or the semiconductor memory device 2000 caused by excessive voltage generation, or the like. Further, on the contrary, it is possible to prevent fluctuation in transistor characteristics caused by the output of a unstable low-frequency oscillation signal VOSC, the following deterioration of a noise resistance, or a loss of stored data or the like in the semiconductor memory device 2000. Here, the fluctuation in the transistor characteristic or the deterioration of the noise resistance may specifically include fluctuations in a backgate bias voltage or the like in the MOS transistor.

At each of the detector sections 11, 12 and 13, the oscillation-frequency control signal VR as an analog voltage value can be detected by the logic gate element where the signal value corresponding to the predetermined oscillation frequency has been adjusted as the threshold voltage, and a digital signal can be obtained as a result of the detection. Processing of the later stage can be executed by the digital signal, and thus it is possible to carry out high-speed processing by the operation of low current consumption at a small circuit.

At the detector section 13, since activation/inactivation of the detector section 13 can be controlled by the enable signal EN, it is possible to reduce unnecessary current consumption by making the detector section 13 inactive in the oscillation inhibiting state.

In addition, if, as a predetermined delay time timed by the delay section, in place of the delay unit T in the delay section 31 of the sixth embodiment, a circuit for timing the predetermined delay time is constructed by circuitry equivalent to that for generating the oscillation-frequency control signal VR at the controller section 42 according to the enable signal EN, then the predetermined delay time can be set by an optimal timing.

Further, by making an arrangement where the enable signal EN, and the detection signal MON or the delay signal D are composed at the signal composing section, and output as an output signal, it is possible to control the operation control unit or the output control unit at the oscillator section after detecting that both signals are in predetermined states.

Figure 15:
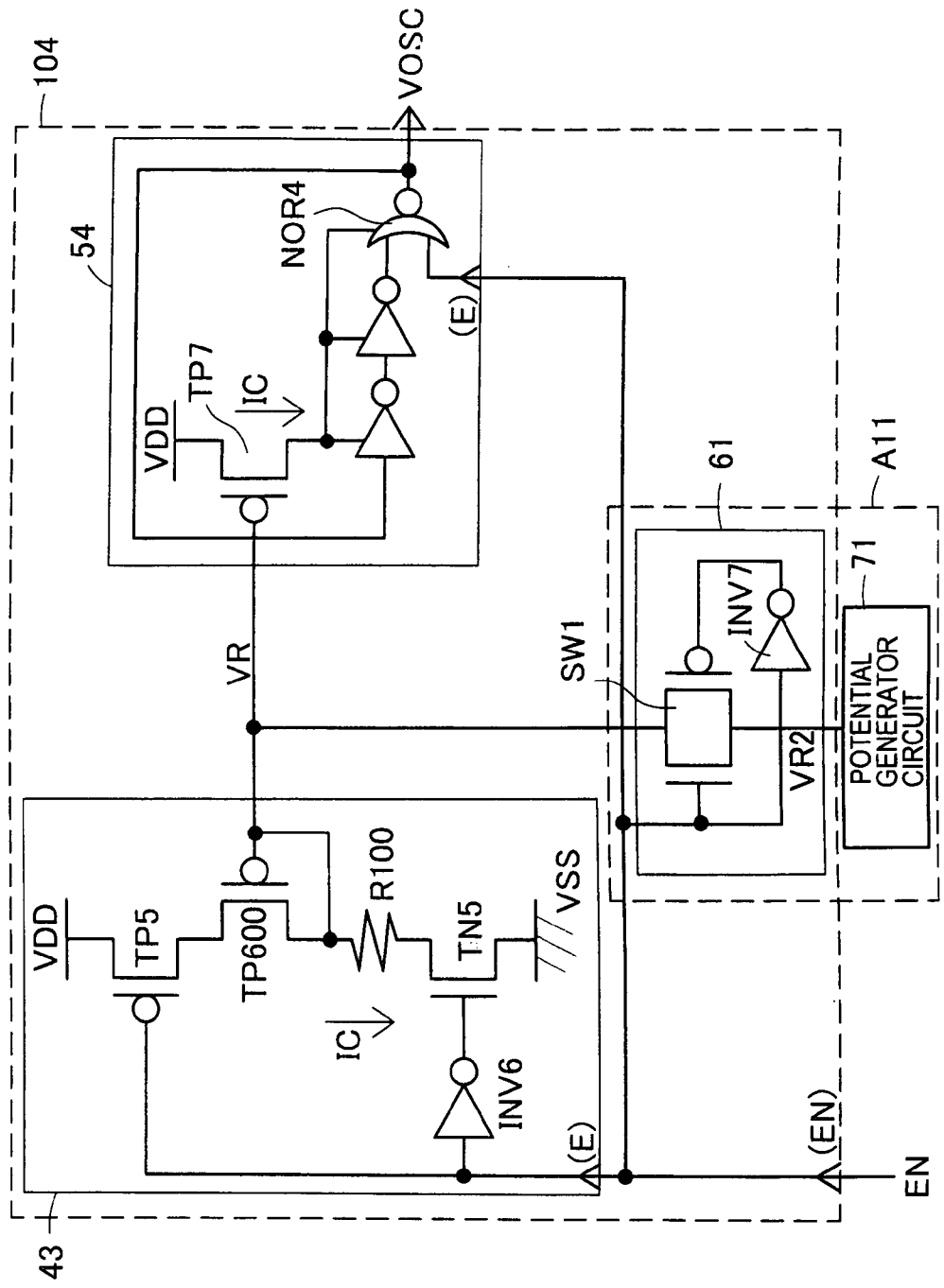
FIG. 15 shows a circuit diagram of a seventh embodiment.

FIG. 15 shows an oscillator circuit 104 corresponding to a seventh embodiment of the fourth principle diagram (FIG. 4). A controller section 43 comprises a PMOS transistor TP5 and an NMOS transistor TN5 in place of the switch element 5100 provided in the controller section 410 of the first specific example of the first prior art. A low active enable signal EN is entered into an enable terminal (E) to directly control a gate terminal of the PMOS transistor TP5 and, and a gate terminal of the NMOS transistor TN5 through an inverter element INV6. At the controller section 43, generally, a bias current IC is set to a small current value limited by a request for low current consuming operation. For example, if a resistance value of a resistance element 8100 is set to 1MΩ, the bias current IC is set to about several microamperes.

An oscillator section 54 is constructed similarly to the oscillator section 54 in the second specific example of the first prior art. An enable signal EN is entered through the enable terminal (E) to one input terminal of a NOR element NOR4 constituting a ring oscillator.

A switch section 61 includes a so-called transfer gate SW1 for connecting source terminals and drain terminals of the PMOS transistor and the NMOS transistor. To be made conductive at a high-level time when a low-active enable signal EN is inactivated, the enable signal EN is directly entered into a gate terminal of the NMOS transistor, and it is logic-inverted through an inverter element INV7 and entered into a gate terminal of the PMOS transistor. The switch element 61 makes a control line VR and a potential generator circuit 71 provided outside the oscillator circuit 104 conductive to each other. The switch section 61 and the potential generator circuit 71 constitute a pre-set circuit All of the control line VR.

Figure 16:
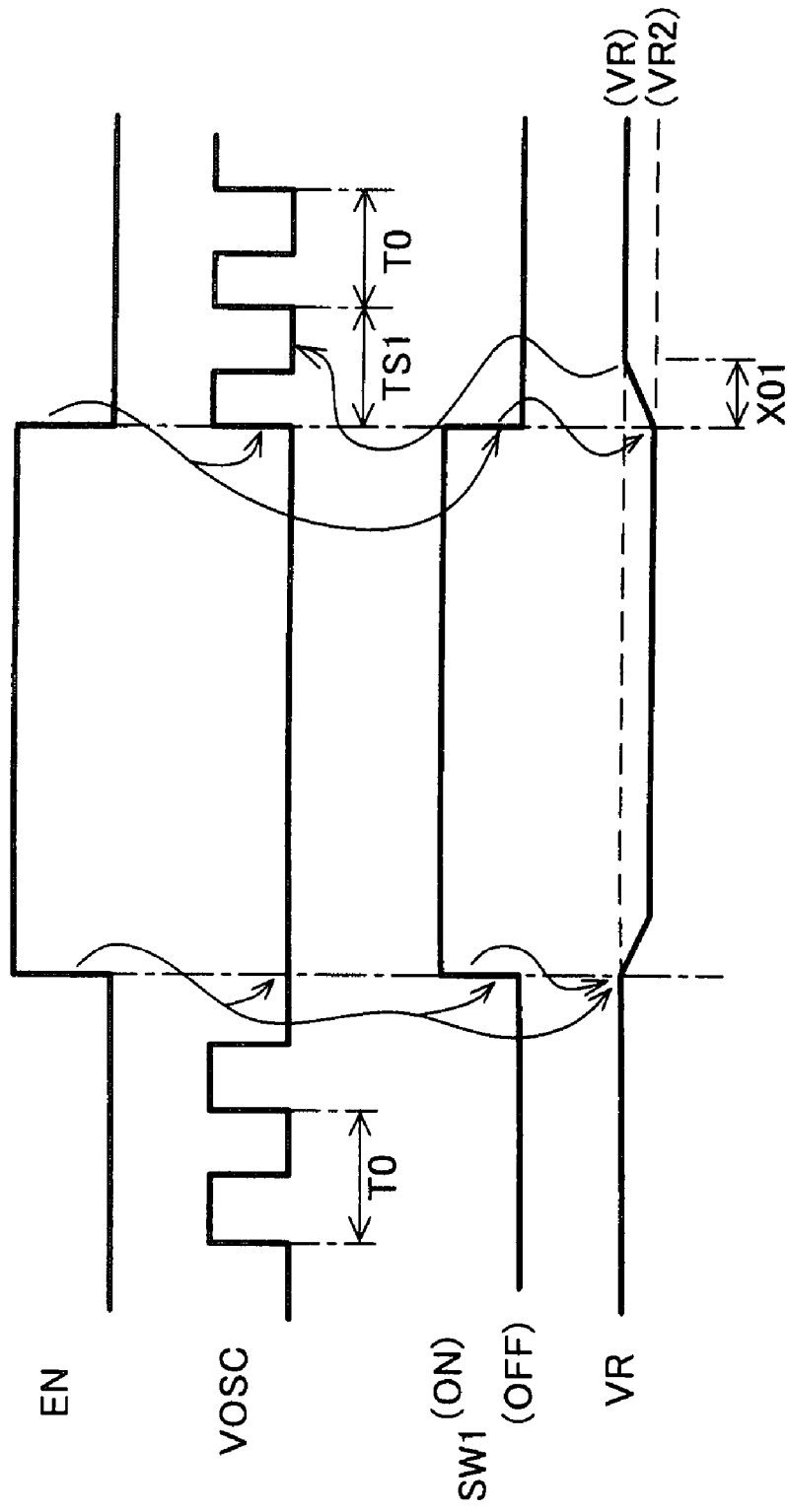
FIG. 16 shows operational waveforms of the seventh embodiment.

FIG. 16 shows an operational waveform. When the enable signal EN is at a low level, a PMOS transistor TP5 and an NMOS transistor TN5 of the controller section 43 are both made conductive to supply a bias current IC. This bias current IC flows to a diode-connected PMOS transistor TP600 to be converted into a voltage value, and then output as a set oscillation-frequency control signal VR to the control line VR.

The set oscillation-frequency control signal VR that has been output to the control line VR is entered into a gate terminal of a PMOS transistor TP7 of the oscillator section 54, and the bias current IC is supplied to each inverter element constituting the ring oscillator and a power source terminal of a NOR element NOR4. Here, it was described that assuming that the PMOS transistors TP600 and TP7 are equal in size, bias current flowing to both was the same bias current IC. However, by properly changing the sizes of both transistors, and setting a difference in driving capabilities, needless to say, it is possible to set a bias current ratio according to the difference in driving capability.

At this time, a low-level enable signal EN is entered into the enable terminal (E) of the oscillator section 54, and the NOR element NOR4 functions as a logic inversion element. Thus, at the oscillation section 54, a loop of the ring oscillator is constructed, and an oscillation signal VOSC of a predetermined frequency is output by each element driven by the bias current IC.

An oscillation frequency of the oscillation signal VOSC is decided by the bias current IC. This bias current IC is decided by the set oscillation-frequency control signal VR generated at the controller section 43. That is, the set oscillation-frequency control signal VR is decided by the bias current IC flowing through the PMOS transistor TP600 having a diode-connected predetermined driving capability, and supplied to the gate terminal of the PMOS transistor TP7 having the predetermined driving capability. Accordingly, a predetermined bias current IC is decided as a power source current of each element constituting the ring oscillator. A propagation delay time by a charging/discharging time of an input capacitor of each stage is decided by the bias current IC, and a time obtained by adding this propagation delay time for one round of the ring oscillator is set as an oscillation cycle TO in a static state.

At this time, since the switch section 61 is in an OFF state, the control line VR and disconnected voltage of the potential generator circuit 71 are disconnected from each other.

Then, assuming that the enable signal EN is changed to a high level to be set in an inactive state, then the controller section 43, the PMOS transistor TP5 and the NMOS transistor TN5 are both set in the OFF state, a current path of the bias current IC is shut off, and an output to the control line VR is set in a floating state. Simultaneously, at the oscillator section 54, an output signal of the NOR element NOR4 is fixed at a low level to shut off the loop of the ring oscillator, and the oscillation signal VOSC is fixed at a low level to stop the oscillating operation.

At this time, the switch section 61 is made conductive (ON) and, in place of the controller section 43 set in the floating state, a voltage level of the control line VR is set to a predetermined level by the potential generator circuit 71. Here, preferably, a predetermined voltage VR2 is set to a voltage level equivalent to the set oscillation-frequency control signal VR.

When the enable signal EN is changed again to the low level to be set in an active state, the switch section 61 is made inactive (OFF) to disconnect the potential generator circuit 71 from the control line VR, and the controller section 43 and the oscillator section 54 are both activated.

As described above in detail, according to the seventh embodiment, when the driving capability of the controller section 43 is limited to a small value by the request for a low current consuming operation or the like, by the pre-set section All comprised of the switch section 61 and the potential generator circuit 71, a voltage level of the control line VR can be maintained at a predetermined voltage VR2 of a voltage level equivalent to the set oscillation-frequency control signal VR in an inactive period by the enable signal EN. Thus, it is possible to return to a static state within a short return time X01. The short return time enables a transient generation period of an oscillation frequency to be short. Moreover, because of the equivalency of the predetermined voltage VR2 to the set oscillation-frequency control signal VR in the inactive period reduces a difference in bias current IC, and a transient oscillation cycle TSI in the return period. can be set near an oscillation cycle TO in the static state.

In this case, preferably, the controller section 43 and the potential generator circuit 71 have equivalent circuitry comprising equivalent circuitry components. Accordingly, the difference in element parameters caused by the manufacturing process or the like affects equivalently, and equivalent bias conditions are maintained for the difference in element parameters. Specifically, if the potential generator section 71 is provided with circuitry equivalent to that of the controller section 43, equivalent element difference is applied. Thus, a voltage level of the set oscillation-frequency control signal VR output from the controller section 43, and the predetermined voltage VR2 output from the potential generator circuit 71 are always set to have a fixed correlation., advantageously.

When the enable signal EN as the oscillation permitting signal becomes a high level to be set inactive, and the controller section 43 is set in an inactive state, the predetermined voltage VR2 as a predetermined signal can be supplied to the control line VR. Thus, when the controller section 43 is activated by the activation of the enable signal EN set to a low level, it is possible to shorten a time delay until the voltage level of the control line VR is charged to the set oscillation-frequency control signal VR, thereby shortening the unstable period of the oscillation frequency in the active period.

It is possible to suppress oscillation frequency fluctuation in the unstable period, an increase in current consumption or voltage fluctuation following the oscillation frequency fluctuation, and erroneous operation caused thereby. Thus, it is suitable for power conservation use represented by the portable device field where the operation state is switched between a normal use state and a stand-by state in which current consumption is kept low in a power down mode or the like.

Figure 17:
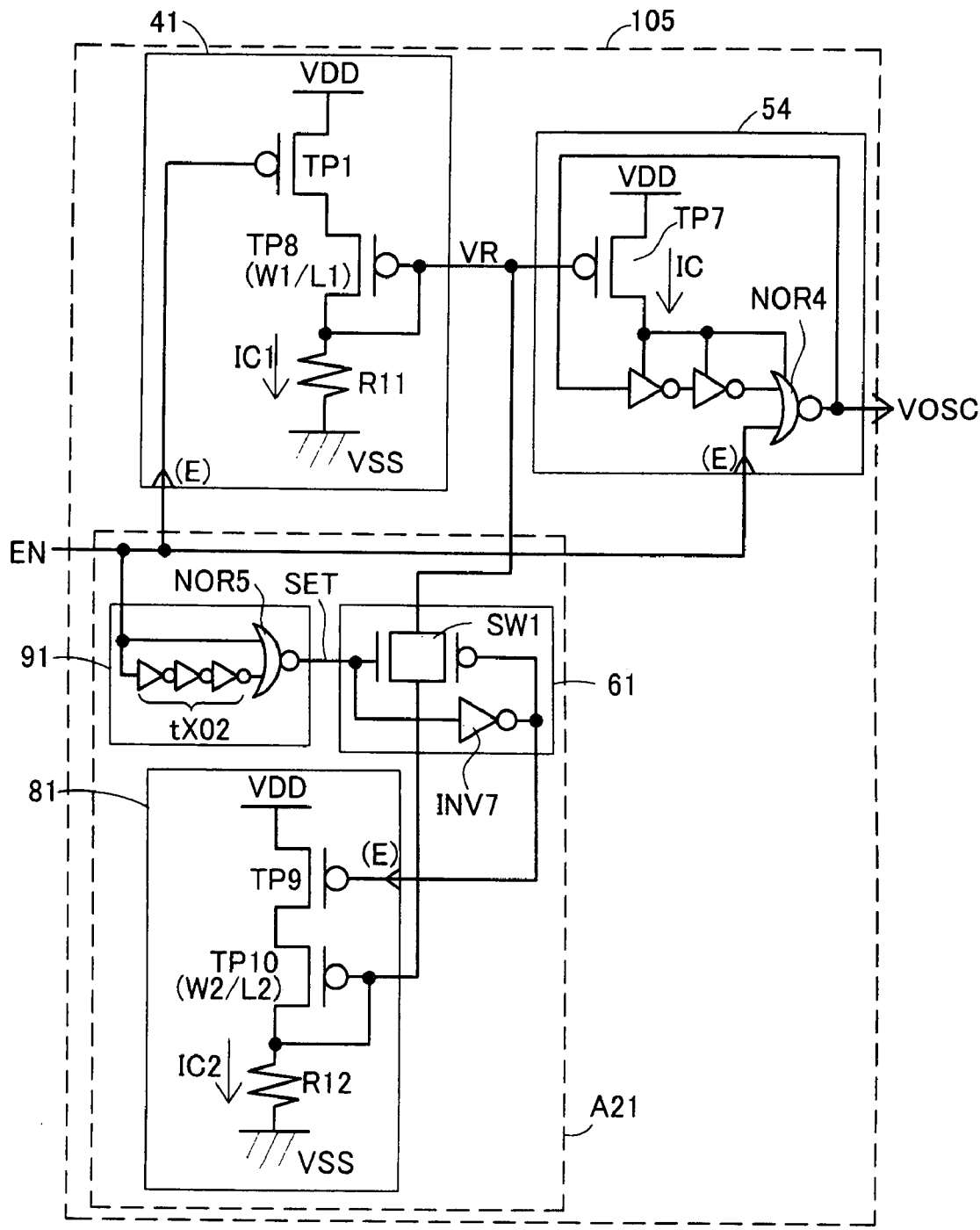
FIG. 17 shows a circuit diagram of an eighth embodiment.

FIG. 17 shows an oscillator circuit 105 according to an eighth embodiment corresponding to the fifth principle diagram (FIG. 5). A first controller section 41 is provided in place of the controller section 43 in the oscillator circuit 104 of the seventh embodiment. Further, in addition to the components of the oscillator circuit 104 of the seventh embodiment, a pulse generator section 91, a second controller section 81 are provided therein. The potential generator circuit 71 used in the seventh embodiment is not used here. A switch section 61, the pulse generator section 91, and the second control section 81 constitute a pre-set section A21.

The first controller section 41 comprises a PMOS transistor TPI in place of the switch element 5100 provided at the controller section 410 of the first specific example of the first prior art. A low active enable signal EN is entered into an enable terminal (E) to directly control a gate terminal of the PMOS transistor TP1.

In addition, in place of the PMOS transistor TP100 and the resistance element 8100, a PMOS transistor TP8 and a resistance element R11 are provided. Here, a gate width and a gate length of the PMOS transistor TP8 are denoted by Wl and L1. A bias current IC1 is set based on a ratio of the gate width and the gate length (gate width/gate length=W1/L1) of the PMOS transistor TP8, and a resistance value of the resistance element R11. As in the case of the controller section 43 of the seventh embodiment, the bias current IC1 is generally set to a small current value limited by a request for low current consuming operation. For example, if a resistance value of the resistance element R11 is set to 1MΩ, the bias current IC1 is set to about several microamperes.

The pulse generator section 91 comprises a NOR element NOR5, and a delay circuit for timing a delay time of tX02, which is composed of serially connected inverter elements of odd stages (3-stage is exemplified in FIG. 17). One input terminal of the NOR element HORS and an input terminal of the delay circuit are connected to the enable signal EN. The other input terminal of the NOR element NORS is connected to an output terminal of the delay circuit. At the pulse generator section 91, a high-level pulse signal. SET is output with a low level transition of the enable signal EN as a trigger signal. In this case, a pulse width becomes tX02. The output pulse signal SET is entered into the switch section 61, inverted by an inverter element INV7 of the switch section 61, and then entered into the enable terminal (E) of the second controller section 81.

The second controller section 81 is similar in constitution to the first. controller section 41. In place of the respective components, i.e., the PMOS transistors TP1 and TP8, and the resistance element R11, of the first controller section 41, PMOS transistors TP9 and TP10, and a resistance element R12 are provided. A pulse signal SET is inverted at the switch section 61, and then entered into the enable terminal (E) to directly control gate terminal of the PMOS transistor TP9. A gate width and a gate length of the PMOS transistor TP10 are denoted by W2 and L2. A bias current IC2 flowing through a current path is set based on a ratio of a gate width and a gate length (gate width/gate length=W2/L2) of the PMOS transistor TP10, and a resistance value of the resistance element R12.

The bias current IC2 of the second controller section 81 is set to be a large current value compared with the bias current IC1. In this case, according to a increase of a current value, W2/L2 is set larger than W1/L1, and a resistance value of the resistance element R12 is smaller than a resistance value of the resistance element R11, so that a bias condition of the second controller section 81 is similar to that of the first controller section 41. Thus, an output from the second controller section 81 made by flowing of the bias current IC2 to the diode-connected PMOS transistor TP10 is set to a voltage level equivalent to a voltage level of an oscillation-frequency control signal VR changed more steeply and set compared with an output from the first controller 41. An output terminal of the second controller section 81 is connected through the switch section 61 to a control line VR in the output period of the pulse signal SET, and is rapidly charged/discharged to a voltage level equivalent to that of the oscillation—frequency control signal VR where the control line VR is set.

Figure 18:
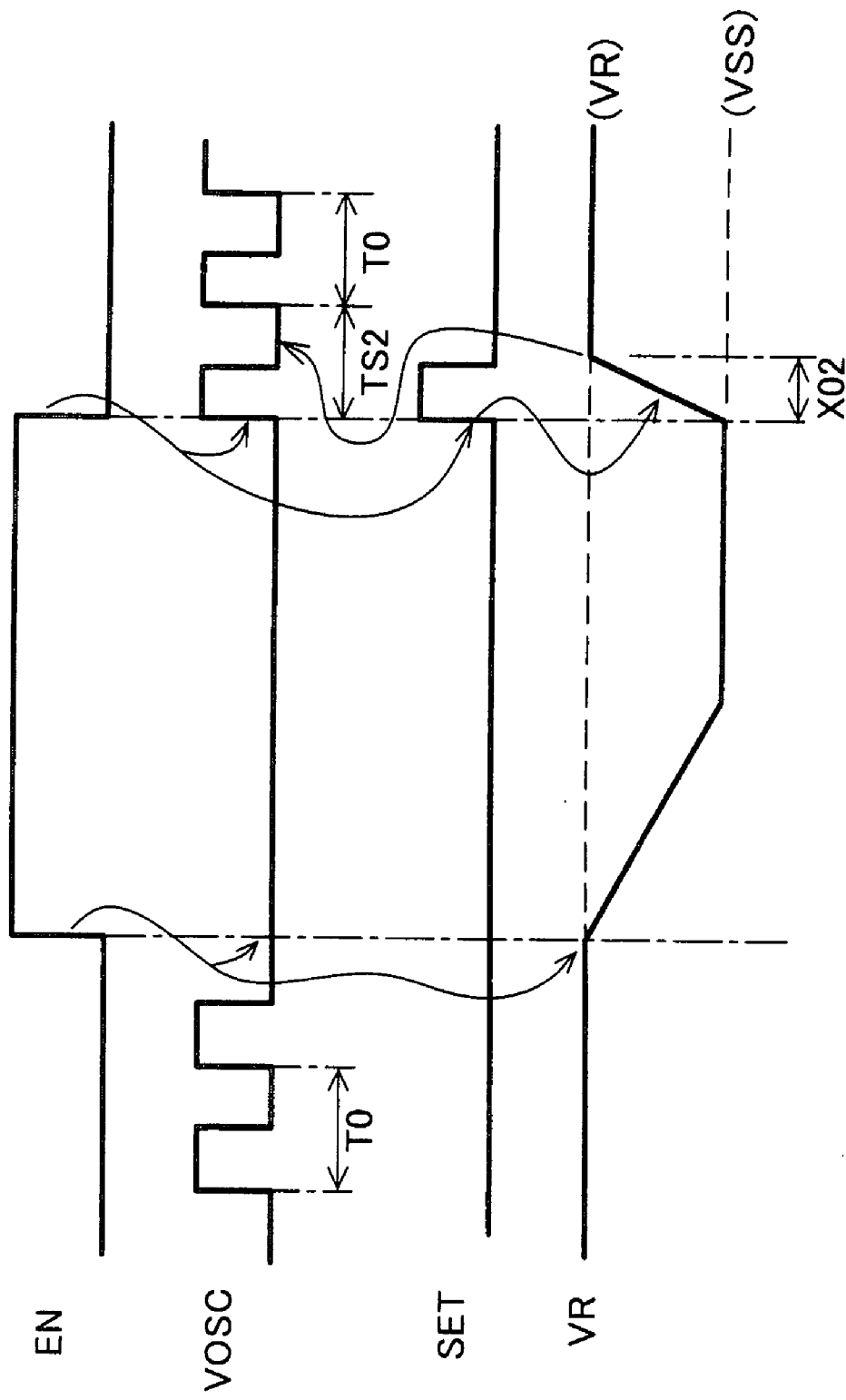
FIG. 18 shows operational waveforms of the eighth embodiment.

FIG. 18 shows an operational waveform. When the enable signal EN is at a low level, an output of the pulse generator section 91 is maintained at a low level, and the switch section 61 is in a nonconductive state. Oscillating operation is similar to that of the operational waveform of the seventh embodiment (FIG. 16), and thus the description thereof is omitted.

If the enable signal EN is changed to a high level to be set in an inactive state, when the PMOS transistor TP1 is turned OFF at the first: controller section 41, a current path of the bias current IC1 is shut off, and an output terminal to the control line VR is connected through the resistance element R11 to a ground voltage VSS. An output of the pulse generator section 91 at this time is maintained at a low level, and the switch section 61 is in a nonconductive state. Thus, a voltage of the control line VR is reduced substantially equivalent to the ground voltage VSS. Simultaneously, an output signal of the NOR element NOR4 of the oscillator section 54 is fixed at a low level to shut off the loop of the ring oscillator, and an oscillation signal VOSC is fixed at a low level to stop the oscillating operation.

When the enable signal EN is changed to the low level again, the first controller section 41 is activated to supply the bias current IC1. Simultaneously, a pulse signal SET is output from the pulse generator section 91. The pulse signal SET makes the switch section 61 conductive to connect the output terminal of the second controller section 81 to the control line VR, and also activate the second controller section 81. The second controller section 81 charges the control line VR to a voltage level equivalent to that of the set oscillation-frequency control signal VR through the switch section 61.

As described above, according to the eighth embodiment, by setting a driving capability of the second controller section 81 sufficiently larger compared with the first controller section 41 having a driving capability limited small by the request for a low current consuming operation or the like, a voltage level of the control line VR can be charged to a voltage level equivalent to that of the set oscillation-frequency control signal VR in the output period of the pulse signal SET. In this case, preferably, by adjusting a current value of the bias current IC2 and the output period of the pulse signal SET; a pulse period tX02 is set to a time equivalent to or more than that for charging the voltage level of the control line VR equivalent to that of the set oscillation—frequency control signal VR.

In this case, preferably, the second controller section 81 and the first controller section 41 have equivalent circuitry comprising equivalent circuit components. Accordingly, the difference in element parameters caused by manufacturing difference or the like affects equivalently both of the controller sections 81 and 41. In the controller sections 81 and 41 which are equivalent in circuitry, equivalent bias conditions are maintained for the difference in element parameters, and equivalent actions/effects can be maintained. Further, if the pulse generator section 91 and the switch section 61 have equivalent circuitry components, with respect to difference in element parameters caused by manufacturing difference or the like, both controller sections 81 and 41, the pulse generator section 91 and the switch section 61 can be set to be varied by having a predetermined correlation, and equivalent actions/effects can be maintained with respect to the difference in element parameters. Specifically, a voltage level of the set oscillation-frequency control signal VR output from the first controller section 41, and a predetermined voltage output from the second controller section 81 are always set to have a fixed correlation. Also, a pulse period tX02 of the pulse signal SET output from the pulse generator section 91, and the bias current IC2 of the second controller section 81 both have correlations with the PMOS transistor driving capability. The correlations mean in this case that when a driving capability is small, a delay time tX02 in the delay section of the pulse generator section 91 is longer, and the bias current IC2 is smaller, and that when the bias current IC2 is small, the pulse period tX02 becomes longer and, when the bias current IC2 is large, the pulse period tX02 becomes shorter. Irrespective. of the difference in element parameters, the control line VR can be charged during the output period of the pulse signal SET.

By the pre-set section A21, in the pulse period tX02 when the enable signal EN is changed to a low level to be set in an active state, the voltage level of the control line VR can be quickly charged to a voltage level equivalent to that of the set oscillation-frequency control signal VR by the second controller section 81. Thus, it is possible to return to the static state within a short return time X02. Because of the short return time, in addition to a short generation period of a transient oscillation frequency, by the quick charging to the voltage level of the set oscillation-frequency control signal VR, a transient oscillation cycle TS2 in the return period can be set near the oscillation cycle T0 in the static state.

When the enable signal EN becomes a low level to be changed to an active state, by the pulse signal SET of the predetermined period tX02, the predetermined signal of a voltage level equivalent to that of the set oscillation frequency control signal VR can be supplied from the second controller section 81 to the control line VR. Accordingly, when the first controller section 41 is activated by the activation of the enable signal EN, it is possible to shorten the delay time until the voltage level of the control line VR is charged to the voltage level equivalent to that of the set oscillation-frequency control signal VR, and thus shorten the unstable period of an oscillation frequency during activation.

It is possible to suppress oscillation frequency fluctuation in the unstable period, an increase in current consumption or voltage fluctuation following the oscillation frequency fluctuation, and erroneous operations, and the like caused thereby. The embodiment is suited for power conservation use represented by the portable device field, where an operational state is switched between a normal use state and a stand-by use state in which current consumption is kept low in a power down mode or the like.

Here, in the seventh or eighth embodiment, detector sections 11, 12 and 1.3 (FIGS. 6, 8 and 12) or a delay section 31 (FIG. 13) can be provided. Thus, it becomes possible to further assure the elimination of the unstable oscillating operation immediately after starting by detecting that the voltage level of the control line VR has reached a predetermined voltage level, or timing the time when it: reaches the predetermined voltage level.

Specifically, in the configuration having the detector sections 11, 12 and 13, the voltage level of the control line VR is detected beforehand and, when a signal corresponding to a predetermined oscillation frequency is reached, oscillating operation can be started or an oscillation signal can be output by controlling the oscillator section 54. When the controller section 43 or the first controller section 41 are activated by the activation of the enable signal EN, by detecting a case where the voltage level of the control line VR has not reached to the voltage level equivalent to that of the oscillation-frequency control signal VR, it is possible to prevent the output of the unstable oscillation frequency in the active state.

In the configuration having the delay section 31, the time required for—stabilizing the oscillation-frequency control signal VR output from the controller section 43 or the first controller section 41 at a set value can be added as a predetermined delay time. Thus, it is possible to obtain a stable oscillation signal after a point of time when the voltage level of the control line VR is stabilized.

Also, here, if a CR delay circuit or the like constituting a delay unit T in the second delay section D2 of the delay section 31 is set corresponding to a time constant of CR delay circuitry comprised of a resistance component of a current path or the like of the bias current IC, IC1, or IC2 in the controller section 43, the first controller section 41 or the second controller section 81, and a capacitive component such as the PMOS/NMOS transistor, the resistance element, or a wiring capacitor, a time equivalent to the time until the voltage level of the control line VR reaches the stable state can be timed by the delay section 31. Further, by configuring the delay unit-c of circuitry equivalent to that of the controller section 43, the first controller section 41 or the second controller section 81, a time equivalent to the time until the voltage level of the control line VR reaches the stable state can be timed. Thus, it is possible to time a predetermined delay time by an optimal timing at the delay section 31.

Figure 19:
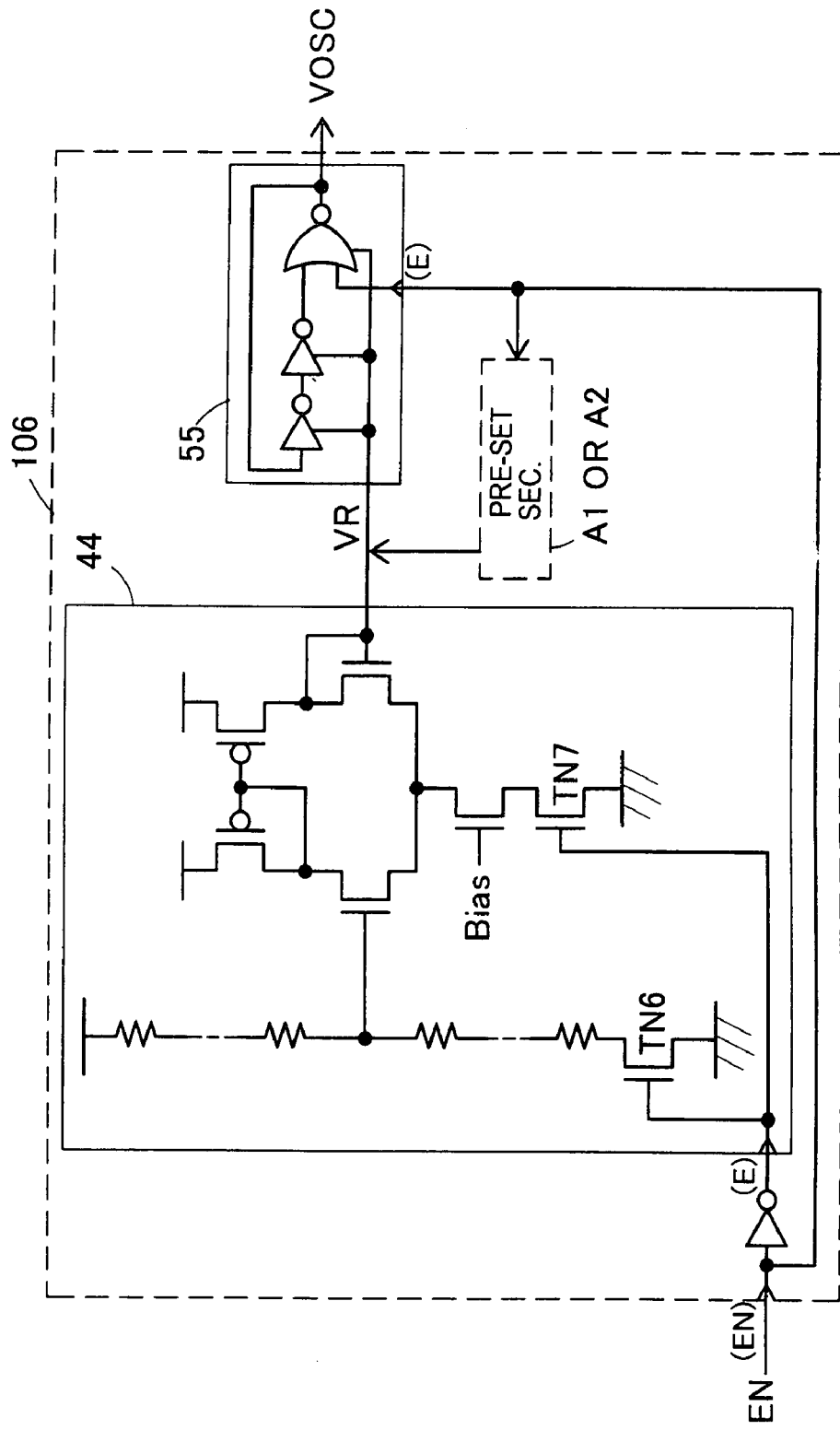
FIG. 19 shows a circuit diagram of a ninth embodiment.

A ninth embodiment shown in FIG. 19 is directed to a so-called voltage control type oscillator circuit 106 for setting an oscillation frequency by controlling a drive power source voltage of an oscillator section 55. A controller section 44 comprises a row of resistance elements, and a buffer circuit. A voltage in a predetermined position of the row of resistance elements are supplied as a drive power source voltage of the oscillator section 55 after the! driving capability at the buffer circuit is added. In the row of resistance elements and the buffer circuit of the controller section 44, NMOS transistors TN6 and TN7 are each provided in current paths of the row of resistance elements and the buffer circuit, and controlled by a signal, which is obtained by inverting an enable signal EN at an inverter element.

In an inactive state where the enable signal EN becomes a high level, the current path is shut off to stop power supplying to the oscillator section 55, thus stopping oscillating operation. In an active state where the enable signal EN becomes a low level, the current path is made conductive to supply power to the oscillator section 55, thus executing oscillating operation.

Also at the oscillator section 106, by providing a pre-set section A1 or A2, actions/effects equivalent to those of the seventh or eighth embodiment can be obtained. Further, detector sections 11, 12 and 13 (FIGS. 6, 8 and 12) or a delay section 31 (FIG. 13) can also be provided.

Figure 20:
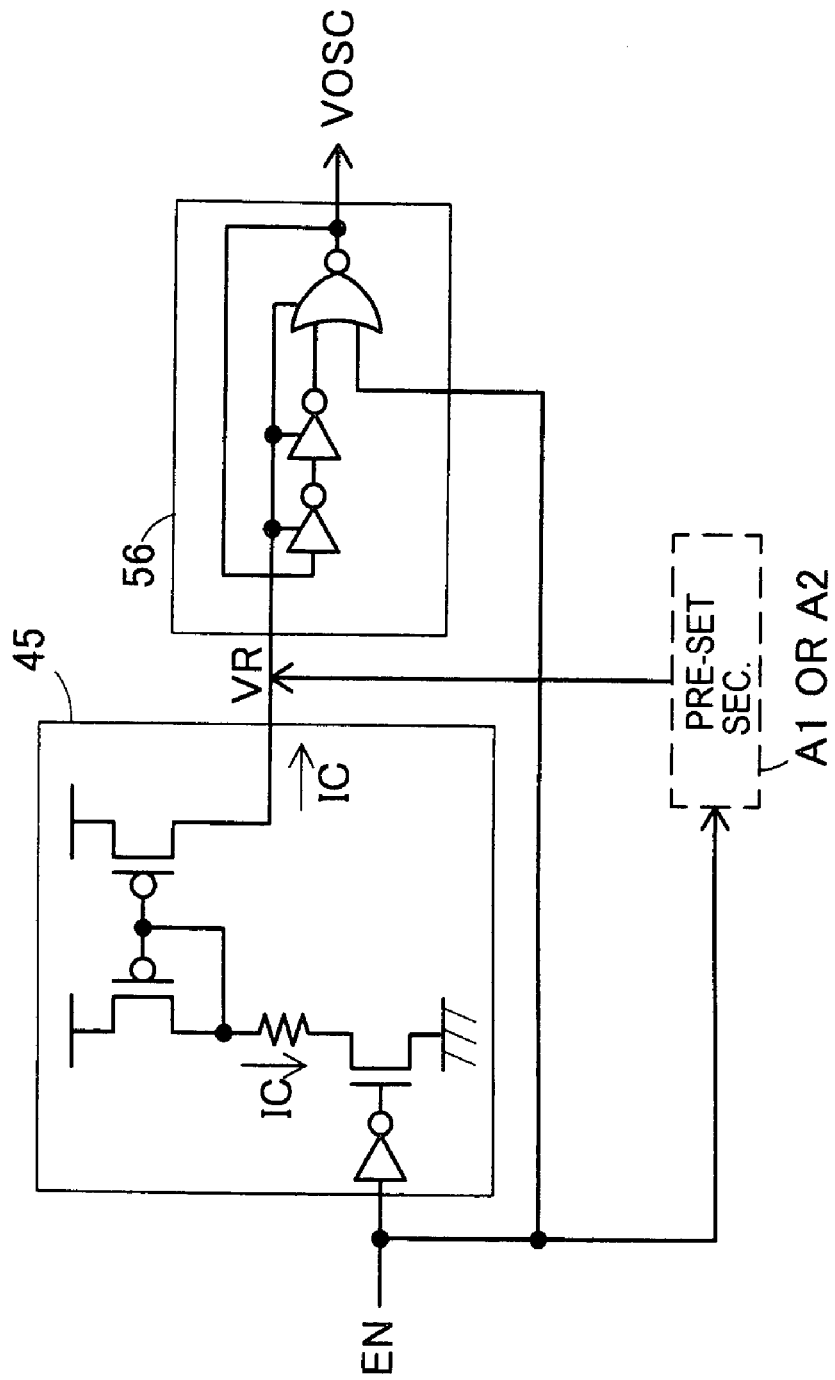
FIG. 20 shows a circuit diagram of a first modification of embodiments including a pre-set section.
Figure 21:
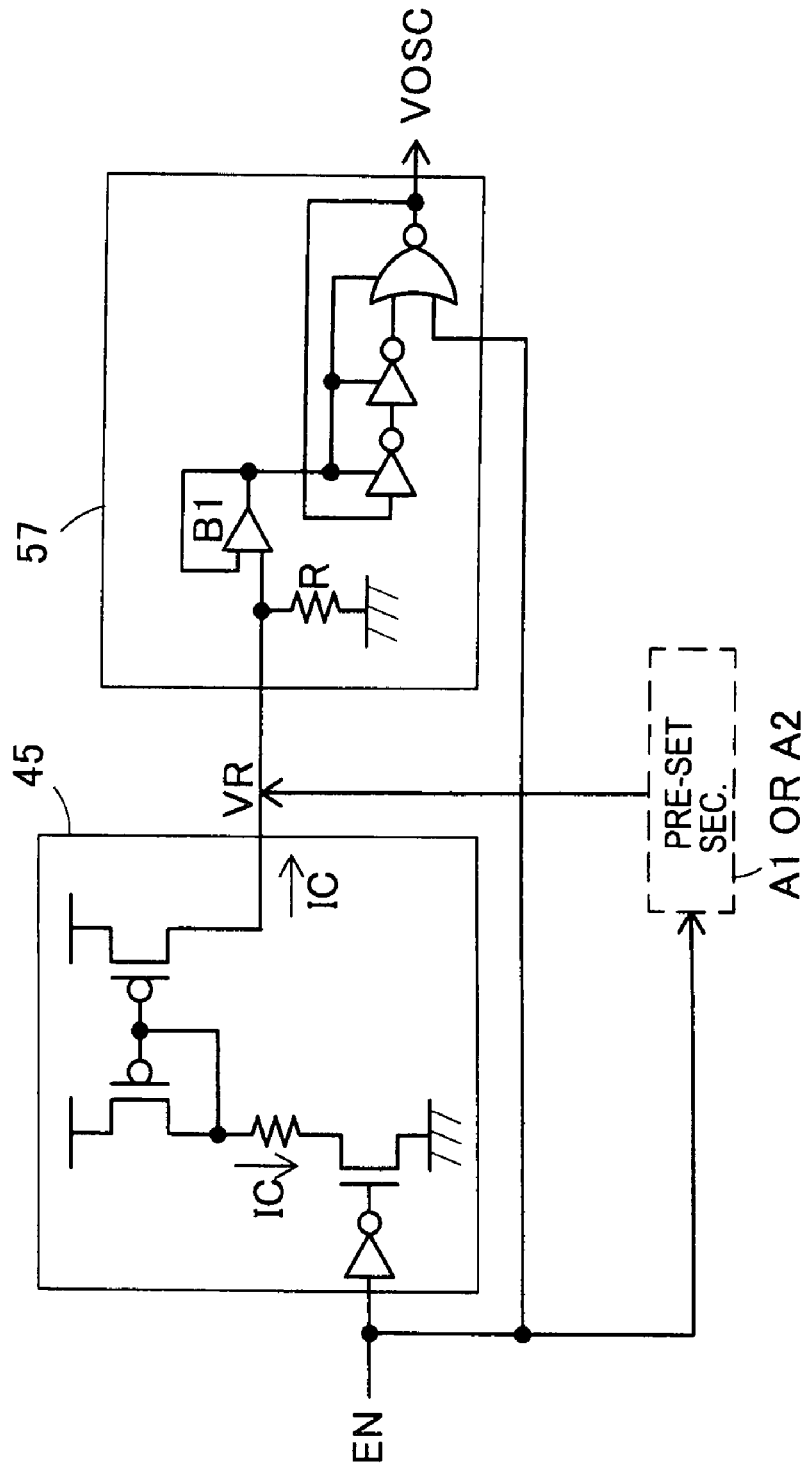
FIG. 21 shows a circuit diagram of a second modification of embodiments including a pre-set section.

FIGS. 20 and 21 show modified examples of a control form of the set oscillation-frequency control signal VR. The seventh or eighth embodiment is the oscillator circuit 104 or 105 which is a current control type, where the oscillation frequency is controlled using the bias current IC as a drive power source current at the oscillator section 54. The oscillator circuit 104 or 105 is an example of circuitry, where as the set oscillation-frequency control signal VR, the bias current IC or IC1 is converted into a voltage value, and propagated to the control line VR by the controller section 43 or the first controller section 41, and reconverted into a drive power source current for control at the oscillator section 54.

In the first modified example of FIG. 20, a controller section 45 and an oscillator section 56 are provided. The controller section 45 has circuitry, where the PMOS transistor TP7 in the oscillator section 54 of the seventh or eighth embodiment is incorporated in the controller section 43 or the first controller section 41, and an output of a bias current IC from a current mirror circuit comprising a PMOS transistor is supplied to a control line VR. The oscillator circuit 56 has circuitry, where the PMOS transistor TP7 is removed from the oscillator section 54, and a bias current supplied from the control line VR is directly used as a drive power source current.

Thus, since an interface between the controller section 45 and the oscillator section 56 is a bias current IC, a high voltage noise tolerance with respect to the control line VR is excellent.

In the second modified example of FIG. 21, an oscillator section 57 is provided in place of the oscillator section 56 of the first modified example (FIG. 20). The oscillator section 57 has a circuit form to be controlled by a drive power source current. A bias current IC propagated through a control line VR is converted into a voltage signal by a resistance element R. The converted voltage signal is supplied as a drive power source voltage through a buffer circuit. This is a circuit form suitable for providing the oscillator section 57 where an oscillation frequency is controlled by the drive power source current, and for securing a voltage noise tolerance with respect to the control line VR.

Also in the first or second modified example, by providing a pre-set section A1 or A2, actions/effects similar to the seventh or eighth embodiment can be obtained. Further, detector sections 11, 12 and 1.3 (FIGS. 6, 8 and 12) or a delay section 31 (FIG. 3) can be provided.

The ninth embodiment is an example of circuitry, different from the voltage control type oscillator circuit where an oscillation frequency is controlled by a drive power source current, as the set oscillation-frequency control signal VR, the drive power source voltage is controlled by the controller section 44.

By providing the above-described oscillator circuits in the semiconductor device 1000 (FIG. 22) or the semiconductor memory device 2000 (FIG. 23), in the semiconductor device 1000 or the semiconductor memory device 2000, a voltage corresponding to an oscillation signal VOSC output from the oscillator circuit 100 can be stably generated quickly after activation by an activation signal ACT at the boosting/negative power source circuit 200 as the voltage generator circuit. At the refresh control circuit 300, a refresh cycle corresponding to the oscillation signal VOSC output from the oscillator circuit 100 can be stably controlled quickly after the activation of the activation signal ACT.

Thus, by limiting the output period of the unstable oscillation signal VOSC when the operation is started by the activation signal ACT to a minimum, and shortening the unstable operation period of the boosting/negative power source circuit 200 or the refresh control circuit 300, it is possible to perform stable circuit operation immediately after activation.

Specifically, it is possible to prevent large current consumption caused by outputting of an unstable high-frequency oscillation signal VOSC, and erroneous operations caused by the following reduction in power source voltage, a reliability problem in the semiconductor device 1000 or the semiconductor memory device 2000 caused by excessive voltage generation, or the like. Further, on the contrary, it is possible to prevent fluctuation in a transistor characteristic caused by outputting of an unstable low-frequency oscillation signal VOSC, the following deterioration of a noise resistance or a loss of-stored data or the like in the semiconductor memory device 2000. Here, the fluctuation in the transistor characteristic or the deterioration of the noise resistance may be fluctuation in a backgate bias voltage or the like in the MOS transistor.

Needless to say, the present invention is not limited to the foregoing embodiments, and various improvements, changes and modifications can be made without departing from the spirit and the scope of the invention.

For example, each of the embodiments was directed to the current driving type oscillator circuit. However, the present invention is not limited to this, and it can be similarly applied to a voltage driving type oscillator circuit.

In both systems of the current and voltage driving types, a drive current or a drive voltage to be controlled can be provided either at a high power source voltage side, or a low power source voltage side. Further, it can be provided at both sides of the high and low power source voltage. In this case, needless to say, the circuitry of the controller section is properly changed depending on an inserting position of a drive current or a drive voltage. Further, regarding control signals of the control line VR for controlling an oscillation frequency, it can be configured for each of the current and voltage signals. Drive current and drive voltage, and control current and control voltage can be properly combined. In this case, needless to say, the circuitry of the controller section, the detector section or the like is properly changed depending on the inserting position of the drive current or the drive voltage. Others, such as a logic level of the enable signal EN, and a voltage level of the control line can be changed appropriately. Needless to say, this case can be dealt with by properly changing the logic level of the controller section, the detector section or the like.

For the actuation/stoppage of the oscillating operation at the oscillator section, the first embodiment showed the constitution, where the operation control of the ring oscillator was carried out by the enable signal EN, and the output control of the oscillation signal VOSC was carried out by the detection signal MON. The second and sixth embodiments showed the example, where the operation control of the ring oscillator was carried out by the oscillation starting signal ON generated by logical composition of the enable signal EN with the detection signal MON or the delay signal D. However, the present invention is not limited to these embodiments and, for the combination of the control signal with the actuation/stoppage unit of the oscillating operation, an optional combination other than those described can be employed.

In the foregoing description, the oscillation frequency set by the oscillation-frequency control signal VR was fixed. However, by varying the resistance element at the controller section, a voltage level of the oscillation-frequency control signal VR can be varied according to a resistance value, thereby varying the oscillation frequency. In this case, as variable resistance, in addition to the switching of the resistance element, ON resistance of the MOS transistor can be used by varying a bias to the gate terminal.

The oscillator section was described by way of the case where it was constructed by the ring oscillator. However, the present invention is not limited to this, any one of the bistable multi-vibrator, the system of repeating charging/discharging to the capacitor component and the like can be used as long as it has circuitry for carrying out oscillating operation.

Moreover, in the case of providing the detector section in the eighth embodiment, an arrangement can be made, where a signal output VR of the first controller section is compared with a signal output VR2 of the second controller section, and a detection signal from the detector section can switch and control the switch section.

The present invention can provide the oscillator circuit, where in the transient unstable period of the oscillation frequency at: the start of oscillation of the oscillator circuit which is capable of controlling actuation/stoppage, by stopping the oscillating operation or preventing outputting of any oscillation signals, or by shortening the transient unstable period of the oscillation frequency at the start of oscillation of the oscillator circuit which is capable of controlling actuation/stoppage, an oscillation circuit which can stabilize an oscillation frequency of an oscillation signal output thereafter, the semiconductor device and the semiconductor memory device provided with the oscillator circuit, and the control method of the oscillator circuit.

The invention claimed is:
1. An oscillator circuit comprising:
an oscillator section for conducting oscillation operation with oscillation frequency in accordance with an oscillation frequency control signal;
a first controller section for outputting the oscillation frequency control signal through a control line to the oscillator section upon activation of an oscillation permitting signal;

a pulse generator section for outputting a pulse signal when the oscillation permitting signal is activated;
a second controller section for outputting a predetermined signal, the second controller section being activated by the pulse signal; and
a switch section arranged between the second controller section and the control line, the switch section being made conductive by the pulse signal and supplying the predetermined signal to the control line.

2. An oscillator circuit according to claim 1, wherein output drive drivability of the second control section is higher than that of the first control section.

3. An oscillator circuit according to claim 1, wherein circuit elements and circuit structure constituted by the circuit elements of the first controller section and those of the second controller section are substantially same.

4. An oscillator circuit according to claim 1, wherein the pulse signal continues until the oscillation-frequency control signal corresponding to a predetermined oscillation frequency is outputted from the first controller section.

5. A semiconductor device comprising:
an oscillator circuit, the oscillator circuit comprising: an oscillator section capable of oscillation operation in accordance with an oscillation permitting signal; a controller section for outputting an oscillation-frequency control signal that controls oscillation frequency toward the oscillator section in accordance with the oscillation permitting signal; and a detector section for detecting the oscillation-frequency control signal and outputting a detection signal that controls the oscillator section in accordance with a detection result; and
a voltage generator circuit for generating voltage in response to an oscillation signal outputted from the oscillator.

6. A semiconductor device according to claim 4, wherein the voltage generator circuit is a boosting voltage generator circuit for generating boosting voltage depending on the oscillation signal.

7. A semiconductor device according to claim 5, wherein the voltage generator circuit is a negative voltage generator circuit for generating negative voltage depending on the oscillation signal.

8. A semiconductor memory device comprising:
an oscillator circuit, the oscillator circuit comprising: an oscillator section capable of oscillation operation in accordance with an oscillation permitting signal; a controller section for outputting an oscillation-frequency control signal that controls oscillation frequency toward the oscillator section in accordance with the oscillation permitting signal; and a detector section for detecting the oscillation-frequency control signal and outputting a detection signal that controls the oscillator section in accordance with a detection result; and a voltage generator circuit for generating voltage in response to an oscillation signal outputted from the oscillator circuit.

9. A semiconductor memory device according to claim 8, wherein the voltage generator circuit is a boosting voltage generator circuit for generating boosting voltage depending on the oscillation signal.

10. A semiconductor memory device according to claim 8, wherein the voltage generator circuit is a negative voltage generator circuit for generating negative voltage depending on the oscillation signal.

11. A semiconductor memory device comprising:
an oscillator circuit, the oscillator circuit comprising: an oscillator section capable of oscillation operation in accordance with an oscillation permitting signal; a controller section for outputting an oscillation-frequency control signal that controls oscillation frequency toward the oscillator section in accordance with the oscillation permitting signal; and a detector section for detecting the oscillation-frequency control signal and outputting a detection signal that controls the oscillator section in accordance with a detection result; and
a refresh control circuit for controlling refresh cycle in response to a oscillation signal outputted from the oscillator circuit.

12. A control method of an oscillator circuit comprising:
step to activate first control operation of oscillation frequencies upon activation of an oscillation permitting signal when oscillation operation is conducted in accordance with an oscillation-frequency control signal; and
step to allow control state itself to shift to predetermined setting state so that the oscillation frequency should shift to a setting value;
wherein the control method controls to activate second control operation that makes the controls state shift to predetermined state for a predetermined period that begins after activation of the oscillation permitting signal.

13. A control method of an oscillator circuit according to claim 12 wherein the predetermined state is equivalent to the predetermined setting state.

14. A control method of an oscillator circuit according to claim 13, wherein shift ability that the second control operation shifts to the predetermined state is higher than shift ability that the first control operation shifts itself to the predetermined setting state.

* * * * *

UNITED STATES PATENT AND TRADEMARK OFFICE
CERTIFICATE OF CORRECTION

| | |
|---|---|
| PATENT NO. | : 7,492,232 B2 |
| APPLICATION NO. | : 11/802637 |
| DATED | : February 17, 2009 |
| INVENTOR(S) | : Yasushige Ogawa et al. |

It is certified that error appears in the above-identified patent and that said Letters Patent is hereby corrected as shown below:

Title Page:

Item (30), please add the omitted Foreign Application Priority Data information to the title page:

-- Japan 2002-3750      January 10, 2002 --

-- Japan 2002-140123      May 15, 2002 --

Item (62), please delete the Continuing Data information and insert the following Continuing Data information:

-- Division of application No. 11/372,146, filed on March 10, 2006, now Patent No. 7,239,210, which is a Division of application No. 10/943,927, filed September 20, 2004, now Patent 7,042,300, which is a Division of application No. 10/265,101, filed October 07, 2002, now Patent 6,809,605 --

Signed and Sealed this

Twelfth Day of January, 2010

David J. Kappos
*Director of the United States Patent and Trademark Office*